(12) United States Patent
Yang et al.

(10) Patent No.: US 12,199,594 B2
(45) Date of Patent: Jan. 14, 2025

(54) SWITCHING TIME REDUCTION OF AN RF SWITCH

(71) Applicant: SKYWORKS SOLUTIONS, INC., Irvine, CA (US)

(72) Inventors: Yi Yang, Malden, MA (US); Bo Zhou, Acton, MA (US); Eric J. Marsan, Walpole, MA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 77 days.

(21) Appl. No.: 18/146,622

(22) Filed: Dec. 27, 2022

(65) Prior Publication Data

US 2023/0216490 A1 Jul. 6, 2023

Related U.S. Application Data

(60) Provisional application No. 63/296,924, filed on Jan. 6, 2022.

(51) Int. Cl.
*H03K 17/0412* (2006.01)
*H03K 3/012* (2006.01)

(52) U.S. Cl.
CPC ....... *H03K 17/04123* (2013.01); *H03K 3/012* (2013.01)

(58) Field of Classification Search
CPC ........... H03K 17/04123; H03K 17/693; H03K 2017/066
See application file for complete search history.

(56) References Cited

U.S. PATENT DOCUMENTS

| | | | |
|---|---|---|---|
| 8,008,988 B1 * | 8/2011 | Yang | H03K 17/693 333/101 |
| 8,334,718 B2 | 12/2012 | Granger-Jones et al. | |
| 8,401,496 B2 | 3/2013 | Goto et al. | |
| 8,461,903 B1 | 6/2013 | Granger-Jones | |
| 9,143,124 B2 | 9/2015 | Cam et al. | |
| 9,438,223 B2 | 9/2016 | de Jongh | |
| 9,742,400 B2 | 8/2017 | Bakalski et al. | |
| 9,847,804 B2 | 12/2017 | Lee et al. | |
| 9,899,988 B2 | 2/2018 | Yu et al. | |
| 10,505,530 B2 | 12/2019 | Ranta et al. | |
| 10,608,623 B2 * | 3/2020 | Kerr | H04B 1/44 |
| 10,693,459 B2 | 6/2020 | Blin | |
| 10,763,842 B1 | 9/2020 | Dai | |

(Continued)

*Primary Examiner* — Sibin Chen
(74) *Attorney, Agent, or Firm* — Lando & Anastasi, LLP

(57) ABSTRACT

A switching component and switch assembly. The switching component comprises a first control node, a common node, a plurality of intermediate nodes, a second control node, and a capacitive node; a plurality of transistors connected in series between the control node and the common node, one of the plurality of intermediate nodes being defined between each series connected pair of transistors, each transistor of the plurality of transistors having a gate coupled to the second control node; and a plurality of capacitive components, one capacitive component being coupled between each intermediate node and the capacitive node, a voltage at the capacitive node being configured to be varied with a voltage at the second control node such that, at each intermediate node, the capacitive component is configured to accrue an opposite charge to the transistors.

20 Claims, 13 Drawing Sheets

(56) References Cited

U.S. PATENT DOCUMENTS

| | | |
|---|---|---|
| 10,848,141 B2 | 11/2020 | Shanjani et al. |
| 10,897,246 B2 | 1/2021 | Scott et al. |
| 11,329,642 B1 | 5/2022 | Shrivastava et al. |
| 11,405,031 B1 | 8/2022 | Shrivastava et al. |
| 11,405,034 B1 | 8/2022 | Shapiro et al. |
| 11,539,362 B1* | 12/2022 | Chen .................... H03K 17/161 |
| 11,632,107 B1 | 4/2023 | Shrivastava et al. |
| 11,671,135 B2* | 6/2023 | Shrivastava ......... H03K 17/693 |
| | | 455/73 |
| 11,777,485 B2 | 10/2023 | Shrivastava et al. |
| 2013/0009725 A1 | 1/2013 | Heaney et al. |
| 2013/0278317 A1 | 10/2013 | Iversen et al. |
| 2014/0118053 A1 | 5/2014 | Matsuno |
| 2014/0266415 A1 | 9/2014 | Kerr et al. |
| 2015/0318889 A1 | 11/2015 | Lee et al. |
| 2016/0191050 A1* | 6/2016 | Englekirk .......... H03K 17/6871 |
| | | 327/382 |
| 2016/0329891 A1 | 11/2016 | Bakalski et al. |
| 2017/0201245 A1 | 7/2017 | Scott et al. |
| 2017/0302259 A1 | 10/2017 | Mokalla |
| 2018/0114801 A1 | 4/2018 | Leipold et al. |
| 2019/0140688 A1 | 5/2019 | Tombak et al. |
| 2021/0194476 A1 | 6/2021 | Blin |
| 2021/0203322 A1 | 7/2021 | Blin |
| 2021/0335857 A1 | 10/2021 | Wang et al. |
| 2023/0246639 A1 | 8/2023 | Blum et al. |

* cited by examiner

810 — ARRANGING A FIRST SWITCH HAVING A FIRST PLURALITY OF TRANSISTORS COUPLED BETWEEN A FIRST NODE AND A SECOND NODE, EACH TRANSISTOR OF THE FIRST PLURALITY OF TRANSISTORS HAVING A GATE, A DRAIN, AND A SOURCE, EACH GATE OF THE FIRST PLURALITY OF TRANSISTORS BEING COUPLED TO A COMMON NODE, THE FIRST NODE COUPLED TO AN INPUT OF THE SWITCH ASSEMBLY, AND THE SECOND NODE COUPLED TO AN OUTPUT OF THE SWITCH ASSEMBLY;

820 — ARRANGING A COMMON RESISTOR COUPLED BETWEEN A FIRST CONTROL NODE AND THE COMMON NODE, AND ARRANGING A SECOND SWITCH COUPLED BETWEEN THE FIRST CONTROL NODE AND THE COMMON NODE IN PARALLEL TO THE COMMON RESISTOR;

830 — CONTROLLING THE SECOND SWITCH TO BE IN AN ON STATE SUCH THAT A FIRST CONTROL SIGNAL RECEIVED BY THE FIRST CONTROL NODE BYPASSES THE COMMON RESISTOR BETWEEN THE FIRST CONTROL NODE AND THE COMMON NODE DURING A PERIOD IN WHICH THE FIRST SWITCH IS TRANSITIONING BETWEEN AN ON STATE AND AN OFF STATE; AND

840 — CONTROLLING THE SECOND SWITCH TO BE IN AN OFF STATE SUCH THAT THE FIRST CONTROL SIGNAL IS COMMUNICATED TO THE COMMON NODE VIA THE COMMON RESISTOR DURING A PERIOD IN WHICH THE FIRST SWITCH IS NOT TRANSITIONING BETWEEN AN ON STATE AND AN OFF STATE.

FIG.8

SWITCHING TIME REDUCTION OF AN RF SWITCH

CROSS-REFERENCE TO RELATED APPLICATIONS

This application claims priority under 35 U.S.C. § 119(e) to U.S. Provisional Application Ser. No. 63/296,924, titled "SWITCHING TIME REDUCTION OF AN RF SWITCH," filed on Jan. 6, 2022, which is hereby incorporated by reference in its entirety.

BACKGROUND

Field

Aspects of the present disclosure relate to a method, a switch assembly, a radio frequency module, and a wireless device for a radio frequency signal. In particular, aspects of the present disclosure relate to assemblies for reducing the switching time of a radio frequency switch.

Description of the Related Technology

Wireless communication devices commonly use one or more instances of transmit and receive circuitry to generate and amplify transmit signals and to amplify and process receive signals, respectively. One or more antennas in such wireless communication devices are typically connected to transmit and receive circuitry through one or more radio frequency (RF) switches, sometimes referred to as "transmit/receive switches" or "antenna switches." In addition, RF switches may be included in antenna tuning circuitry connected to the one or more antennas and operated to tune the one or more antennas to different frequencies or frequency bands. Furthermore, RF switches may be included after a broadband amplifier to direct relevant portions of an RF signal to one of a plurality of filters that are specific to a particular frequency band for band specific processing. Such switches are sometimes referred to as "band select switches."

During operation, such RF switches are required to be capable of meeting stringent performance requirements for switching and settling times. This is increasingly important as evolving standards for RF networks desire faster and faster switching times to increase the number of slots/symbols in each subframe to increase the corresponding data rates. Conventional approaches for reducing the switching/settling times of such RF switches can often degrade isolation performance of the RF switch and increase the losses in the switch.

SUMMARY

According to one embodiment there is provided a switching component for use in a switch assembly. The switching component comprises a first control node, a common node, a plurality of intermediate nodes, a second control node, and a capacitive node; a plurality of transistors connected in series between the control node and the common node, one of the plurality of intermediate nodes being defined between each series connected pair of transistors, each transistor of the plurality of transistors having a gate coupled to the second control node; and a plurality of capacitive components, one capacitive component being coupled between each intermediate node and the capacitive node, a voltage at the capacitive node being configured to be varied with a voltage at the second control node such that, at each intermediate node, the capacitive component is configured to accrue an opposite charge to the transistors.

In one example, each capacitive component is configured to release its accrued charge when the transistors connected to the same intermediate node are transitioned from an OFF state to an ON state.

In one example, each intermediate node is connected to a first transistor having a first parasitic capacitance between the gate of the first transistor and the intermediate node and a second transistor having a second parasitic capacitance between the gate of the second transistor and the intermediate node. Each capacitive component has a capacitance between the respective intermediate node and the capacitive node, wherein for each intermediate node the capacitance of the connected capacitive component is equal or approximately equal to the sum of the first and second parasitic capacitances.

In one example, for each intermediate node, the first transistor has a drain connected to the intermediate node and the second transistor has a source connected to the intermediate node, and wherein the first parasitic capacitance is formed between the gate of the first transistor and the drain of the first transistor and wherein the second parasitic capacitance is formed between the gate of the second transistor and the source of the second transistor.

In one example, the switching component further comprises a first common resistor between the control node and the common node and in parallel with the plurality of transistors.

In one example, the first common resistor comprises a plurality of resistive elements, and each of the plurality of transistors has a corresponding resistive element of the plurality of resistive elements connected in parallel with it such that each transistor is configured to selectively bypass its corresponding resistive element.

In one example, the plurality of capacitive components are capacitors.

In one example, the plurality of capacitive components are transistors, wherein for each of the transistors the source and drain are connected.

According to another embodiment there is provided a switch assembly for a radio frequency signal. The switch assembly comprises a first node coupled to an input of the switch assembly, a second node coupled to an output of the switch assembly, a first control node, a second control node, a common node, a plurality of intermediate nodes, and a capacitive node; a first switch having a first plurality of transistors coupled between the first and second nodes, each transistor of the first plurality of transistors having a gate, a drain, and a source, each gate of the first plurality of transistors being coupled to the common node; a second switch coupled between the first control node and the common node, the second switch having a second plurality of transistors connected in series between the control node and the common node, one of the plurality of intermediate nodes being defined between each series connected pair of transistors, each transistor of the second plurality of transistors having a gate coupled to the second control node; and a plurality of capacitive components, one capacitive component being coupled between each intermediate node and the capacitive node, a voltage at the capacitive node being configured to be varied with a voltage at the second control node such that, at each intermediate node, the capacitive component is configured to accrue an opposite charge to the transistors.

In one example, each capacitive component is configured to release its accrued charge when the transistors connected to the same intermediate node are transitioned from an OFF state to an ON state.

In one example, each intermediate node in the second switch is connected to a first transistor in the second plurality of transistors, the first transistor having a first parasitic capacitance between the gate of the first transistor and the intermediate node, and a second transistor in the second plurality of transistors, the second transistor having a second parasitic capacitance between the gate of the second transistor and the intermediate node. Each capacitive component has a capacitance between the respective intermediate node and the capacitive node, wherein for each intermediate node the capacitance of the connected capacitive component is equal or approximately equal to the sum of the first and second parasitic capacitances.

In one example, for each intermediate node in the second switch, the first transistor has a drain connected to the intermediate node and the second transistor has a source connected to the intermediate node, and wherein the first parasitic capacitance is formed between the gate of the first transistor and the drain of the first transistor and wherein the second parasitic capacitance is formed between the gate of the second transistor and the source of the second transistor.

In one example, the switching assembly further comprises a first common resistor between the control node and the common node and in parallel with the second plurality of transistors.

In one example, the first common resistor comprises a plurality of resistive elements, and each of the second plurality of transistors has a corresponding resistive element of the plurality of resistive elements connected in parallel with it such that each transistor in the second plurality of transistors is configured to selectively bypass its corresponding resistive element.

In one example, the plurality of capacitive components are capacitors.

In one example, the plurality of capacitive components are transistors, wherein for each of the transistors the source and drain are connected.

In one example, the first control node is configured to receive a first control signal that is applied to the gates of the first plurality of transistors via the second switch through the second plurality of transistors and/or through the plurality of resistors.

In one example, the first control signal is configured to operate the switch in an ON state by turning on each of the first plurality of transistors such that a radio frequency signal received at the first node is provided to the second node.

In one example, the first control signal is configured to operate the switch in an OFF state by turning off each of the first plurality of transistors such that a radio frequency signal received at the first node is not provided to the second node.

In one example, the second control node is configured to receive a second control signal that is configured to operate the second switch in an OFF state such that the first control signal is applied to the gates of the first plurality of transistors through the plurality of resistors.

In one example, the second control node is configured to receive a second control signal that is configured to operate the second switch in an ON state such that the common resistor is shorted and such that the first control signal is applied to the gates of the first plurality of transistors through the second plurality of transistors.

In one example, the second control signal is configured to operate the second switch in the ON state whilst the first control signal is configured to transition the first switch between an ON state and an OFF state.

In one example, the output of the switch assembly is a reference voltage.

In one example, the first switch further comprises a first plurality of gate resistors, each gate resistor of the first plurality of gate resistors coupled between a respective gate of the first plurality of transistors and the common node.

In one example, the second switch further comprises a second plurality of gate resistors, each gate resistor of the second plurality of gate resistors coupled between a respective gate of the second plurality of transistors and the second control node.

In one example, the second switch further comprises a second common resistor coupled between the second control node and each of the second plurality of gate resistors.

In one example, the first switch further comprises a plurality of drain-source resistors, each drain-source resistor being coupled between the drain and source of a corresponding transistor of the first plurality of transistors.

In one example, the first plurality of transistors and/or the second plurality of transistors are field effect transistors.

In one example, the first plurality of transistors and/or the second plurality of transistors are metal oxide semiconductor field effect transistors.

In one example, the switch assembly further comprises a resistor-capacitor filter coupled between the first control node and the second switch.

In one example, the switch assembly further comprises a voltage level shifter coupled between the first control node and the second switch, the voltage level shifter configured to output a positive voltage and a negative voltage.

According to another embodiment there is provided a radio frequency module. The radio frequency module comprises a packaging substrate configured to receive a plurality of components; and a switch assembly according to preceding embodiments, the switch assembly being implemented on the packaging substrate.

In one example, the radio frequency module is a front end module.

In one example, the switch assembly is one of an antenna switch or a band select switch.

According to another embodiment there is provided a wireless device. The wireless device comprises a transceiver configured to generate a radio frequency signal; a front end module in communication with the transceiver, the front end module including a packaging substrate configured to receive a plurality of components, the front end module including a switch assembly according to preceding embodiments, the switch assembly being implemented on the packaging substrate; and an antenna in communication with the front end module, the antenna configured to transmit the amplified radio frequency signal.

According to another embodiment there is provided a method of designing a switch assembly for a radio frequency signal. The method comprises arranging a first switch having a first plurality of transistors coupled between a first node and a second node, each transistor of the first plurality of transistors having a gate, a drain, and a source, each gate of the first plurality of transistors being coupled to a common node, the first node coupled to an input of the switch assembly, and the second node coupled to an output of the switch assembly; arranging a second switch coupled between the first control node and the common, the second switch having a second plurality of transistors connected in series between the control node and the common node, one of the plurality of intermediate nodes being defined between each series connected pair of transistors, each transistor of the second plurality of transistors having a gate coupled to the second control node; and a plurality of capacitive components, one capacitive component being coupled between each intermediate node and the capacitive node, a voltage at the capacitive node being configured to be varied with a voltage at the second control node such that, at each intermediate node, the capacitive component is configured to accrue an opposite charge to the transistors; controlling the second switch to be in an ON state such that a first control signal received by the first control node passes through the second plurality of transistors between the first control node and the common node during a period in which the first switch is transitioning between an ON state and an OFF state; and controlling the second switch to be in an OFF state such that the first control signal does not pass through the second plurality of transistors between the first control node and the common node during a period in which the first switch is not transitioning between an ON state and an OFF state.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures:

FIG. 8 is a flowchart of an example method of designing a switch assembly according to aspects of the present disclosure.

DETAILED DESCRIPTION

Aspects and embodiments described herein are directed to an improved switch assembly for radio frequency (RF) signals that provides improved switching and settling times in an RF switch. For example, this can provide a fast RF switch for switching between different antennas in an antenna switch, or for switching between different band pass filter paths in a band select switch.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

As discussed above, wireless communication devices often include one or more RF switches to couple transmit and/or receive circuitry to one or more antennas, and/or to couple the one or more antennas to antenna tuning circuitry. For example, RF switches may be configured to provide transmit signals from transmit circuitry to an antenna, to provide signals received by an antenna to receive circuitry, or to couple an antenna to antenna tuning circuitry. In some examples, the RF switches may be included within antenna tuning circuitry and may be configured to connect and disconnect various combinations of capacitors and inductors to the antenna for tuning purposes. Furthermore, RF switches may be configured as band select switches to provide portions of a broadband RF signal from a broadband amplifier to one of a plurality of filters that are specifically tuned to a particular frequency band for band specific processing.

In some examples, such RF switches may be transistor-based switches. In certain examples, such RF switches may include multiple transistor-based switches and the transistor-based switches may be assembled or arranged to provide an RF switch having a desired number of inputs (e.g., poles) and outputs (e.g., throws).

Figure 1A:
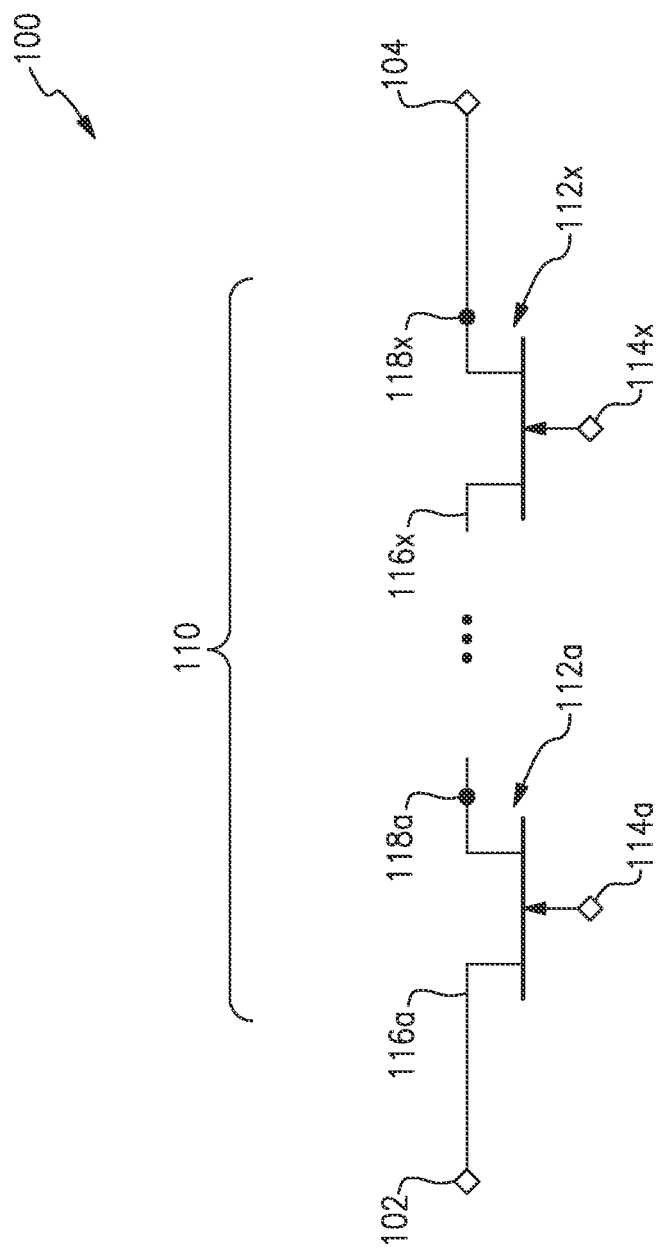
FIG. 1A is a schematic diagram of an example of a transistor-based switch assembly.

FIG. 1A illustrates one example of a transistor-based signal switch assembly 100 having a signal input 102 and a signal output 104 and including a series switch 110 coupled between the signal input 102 and the signal output 104. In various examples, the signal input 102 and the signal output 104 may be reversible without affecting the component, e.g., the switch 100.

In one example, the series switch 110 includes a plurality of field effect transistors (FETs) 112 arranged in series and coupled between the signal input 102 and the signal output 104. Each FET of the plurality of series FETs 112 may have a gate 114, a drain 116, and a source 118. In certain examples, each FET may also have a body contact (not shown). In some examples, the plurality of series FETs 112 includes a first FET 112a having a drain 116a coupled to the signal input 102 and a last FET 112x having a source 118x coupled to the signal output 104. In other examples, the plurality of series FETs 112 may be arranged differently, for example, the source 118a of the first FET 112a may be coupled to the signal input 102 and the drain 116x of the last FET 112x may be coupled to the signal output 104. In some examples, the plurality of series FETs 112 may include additional FETs coupled in series between the first FET 112a and the last FET 112x.

In one example, a control signal voltage applied to, and received at, the gate 114 of each FET of the plurality of series FETs 112 controls the conductivity of a channel between the drain 116 and the source 118 of each FET. In some examples, the gates 114 of the plurality of series FETs 112 may be coupled to one another and configured to receive the same control signal voltage, such that the plurality of series FETs 112 may be controlled in unison. In one example, the switch 100 may be operated in an "ON state" by controlling the plurality of series FETs 112 to be conducting (on) and in the "OFF state" by controlling the plurality of series FETs 112 to be non-conducting (off).

Figure 1B:
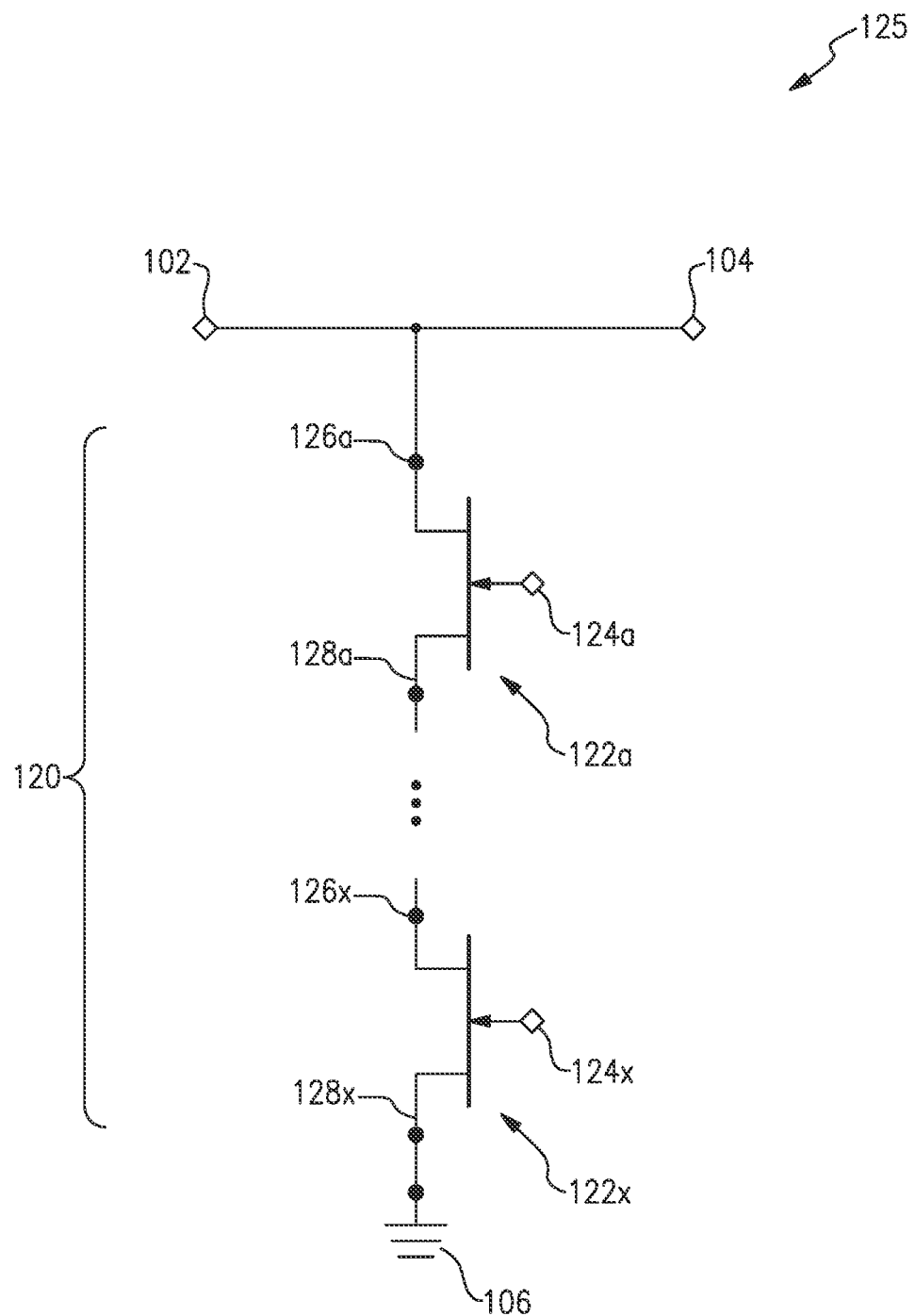
FIG. 1B is a schematic diagram of an example of a transistor-based switch assembly.

FIG. 1B illustrates one example of a transistor-based signal switch assembly 125 including a shunt switch 120 coupled between the signal input 102, the signal output 104, and a reference node 106 (e.g., a ground or neutral). In various examples, the signal input 102 and the signal output 104 may be reversible without affecting the component, e.g., the switch 125. In one example, the signal input 102 and/or the signal output 104 of the switch assembly 125 may be coupled to a series switch (e.g., series switch 110 of FIG. 1A). As such, the shunt switch 120 may be configured to shunt signals received at the signal input 102 and/or output 104 when the series switch is non-conducting (off). In some examples, the signal input 102 and/or output 104 of the switch assembly 125 may be coupled to a device (e.g., an amplifier), and the shunt switch 110 may be configured to shunt signals at the input or the output of the device.

In one example, the shunt switch 120 includes a plurality of shunt FETs 122, and each FET of the plurality of shunt FETs 122 has a gate 124, a drain 126, and a source 128. In certain examples, each FET may also have a body contact (not shown). In some examples, the plurality of shunt FETs 122 includes a first FET 122a having a drain 126a coupled to the signal input 102 and signal output 104, and a last FET 122x having a source 128x coupled to the reference node 106. In other examples, the shunt FETs 122 may be arranged differently, for example, the source 128a of the first FET 122a may be coupled to the signal input 102 and the signal output 104, and the drain 126x of the last FET 122x may be coupled to the reference node 106. In some examples, the plurality of shunt FETs 122 may include additional FETs coupled between the first FET 122a and the last FET 122x. For example, the source 128a of the first FET 122a may be coupled to a drain 126b of a second FET 122b, the source 128b of the second FET 122b may be coupled to the drain 126c of a third FET 122c, and so on.

In one example, a control voltage applied as a control signal to, and received at, the gate 124 of each FET of the plurality of shunt FETs 122 controls the conductivity of a channel between the source 128 and the drain 126 of each FET. In some examples, the gates 124 of the plurality of shunt FETs 122 may be coupled to one another and configured to receive the same control voltage, such that the plurality of shunt FETs 122 may be controlled in unison. In one example, the switch 120 may be operated in an "ON state" by controlling the plurality of shunt FETs 122 to be conducting (on) and in the "OFF state" by controlling the plurality of shunt FETs 122 to be non-conducting (off).

Figure 1C:
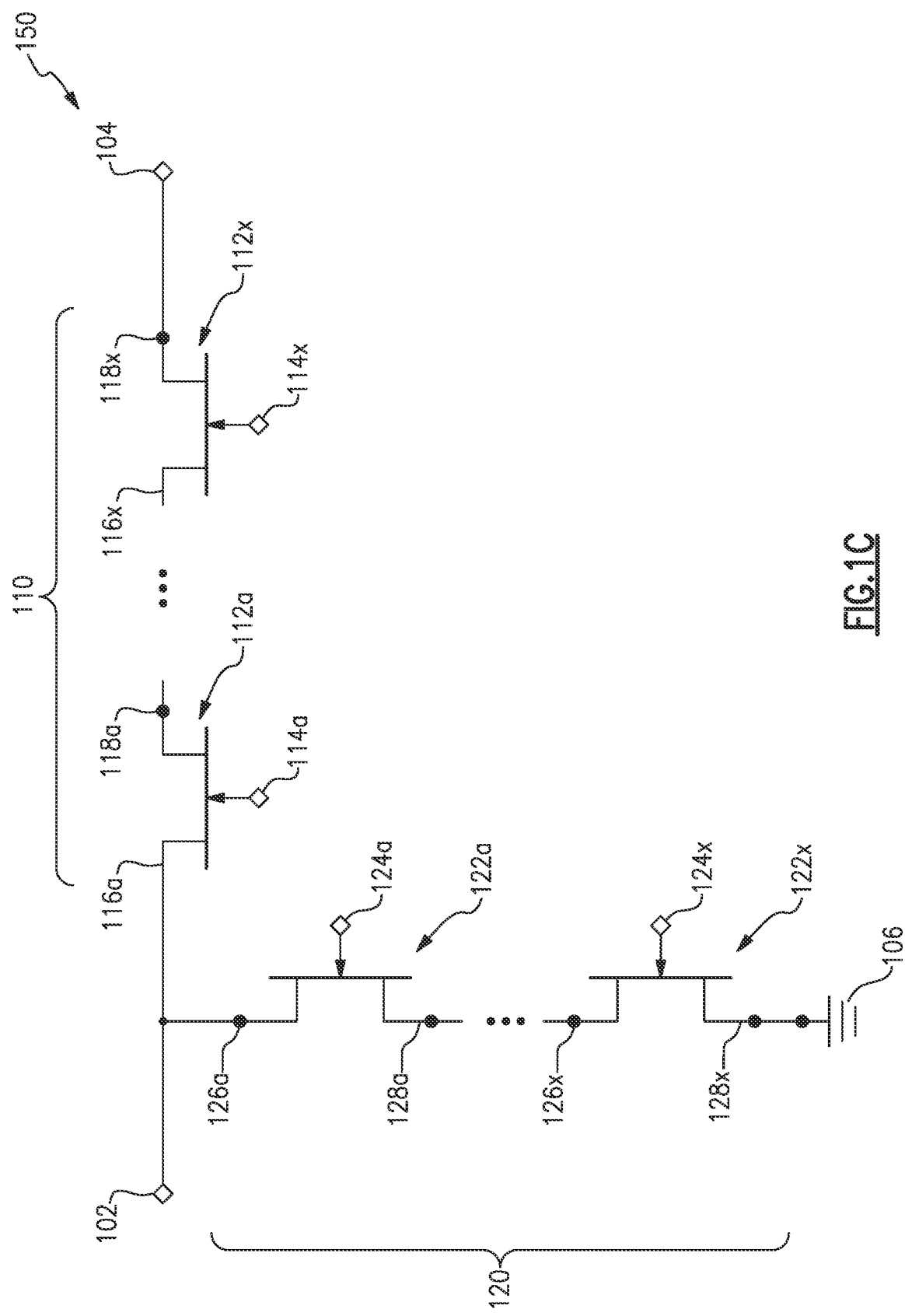
FIG. 1C is a schematic diagram of an example of a transistor-based switch assembly.

FIG. 1C illustrates one example of a transistor-based signal switch assembly 150 including the series switch 110 between the signal input 102 and the signal output 104 and the shunt switch 120 between the signal input 102 and the reference node 106. In other examples, the shunt switch 120 may be included between the signal output 104 and reference node 106. In various examples, the signal input 102 and the signal output 104 may be reversible without affecting the component, e.g., the switch 150.

The switch 150 is controllable to be in an "ON state" to conduct a signal received at the signal input 102 and provide the signal to the signal output 104 by controlling the plurality of series FETs 112 to be conducting (on) and controlling the plurality of shunt FETs 122 to be non-conducting (off) by applying appropriate control voltages to each of the gates 114, 124. Likewise, the switch 150 is controllable to be in an "OFF state" to substantially block signals received at the signal input 102 from being provided to the signal output 104 by controlling the plurality of series FETs 112 to be non-conducting (off) and controlling the plurality of shunt FETs 122 to be conducting (on) by applying appropriate control voltages to each of the gates 114, 124. In such an OFF state, the switch 150 prevents signals from passing through to the signal output 104, at least in part due to the plurality of series FETs 112 presenting a (capacitive) open circuit between the input 102 and the output 104, while the plurality of shunt FETs 122 provide a conducting signal path to the reference node 106, substantially shorting or diverting the signal received at the signal input 102 to the reference node 106.

The FETs of the plurality of series FETs 112 and the plurality of shunt FETs 122 in the examples described above may each be one of many types of FETs known in the art. For example, each may be a metal oxide semiconductor FET (MOSFET), or a silicon on insulator (SOI) MOSFET, and may be of N-channel or P-channel types, and enhancement or depletion mode types. In other examples, each FET may be a gallium arsenide (GaAs) FET, a gallium nitride (GaN) FET, or another type of FET.

As discussed above, the gates 114 of the plurality of series FETs 112 may be coupled together such that the plurality of series FETs 112 may be controlled (e.g., turned on and off) in unison. Similarly, the gates 124 of the plurality of shunt FETs 122 may be coupled together such that the plurality of shunt FETs 122 may be controlled (e.g., turned on and off) in unison. In some examples, control voltages may be applied to the gates 114, 124 through one or more gate resistors.

In many RF applications, it is desirable for transistor-based signal switches to have high off resistances and fast switching times. In one example, the off resistance ($R_{off}$) of a transistor-based signal switch may correspond to the total resistance seen by an RF signal applied to an input of the RF switch while the switch is turned off (i.e., open). In some examples, gate resistors can affect the value of $R_{off}$ transistor-based signal switches (e.g., switches 100, 125, and 150). For example, the $R_{off}$ of each switch may be proportional to the values of the gate resistors such that higher valued gate resistors may contribute to a higher $R_{off}$, and lower valued gate resistors may contribute to a lower $R_{off}$. In some examples, the switching time of each switch may correspond to the values of the gate resistors. For example, higher valued gate resistors may correspond, at least in part, to slower switching times and lower valued gate resistors may correspond to faster switching times. This may be due to higher gate resistances increasing the amount of time that it takes to capacitively charge the gate(s) of transistor-based signal switches to transition the FETs into the conducting ON state, and also increasing the amount of time that it takes to discharge the capacitance of the gate(s) in order to transition the FETs into the non-conducting OFF state.

Figure 2A:
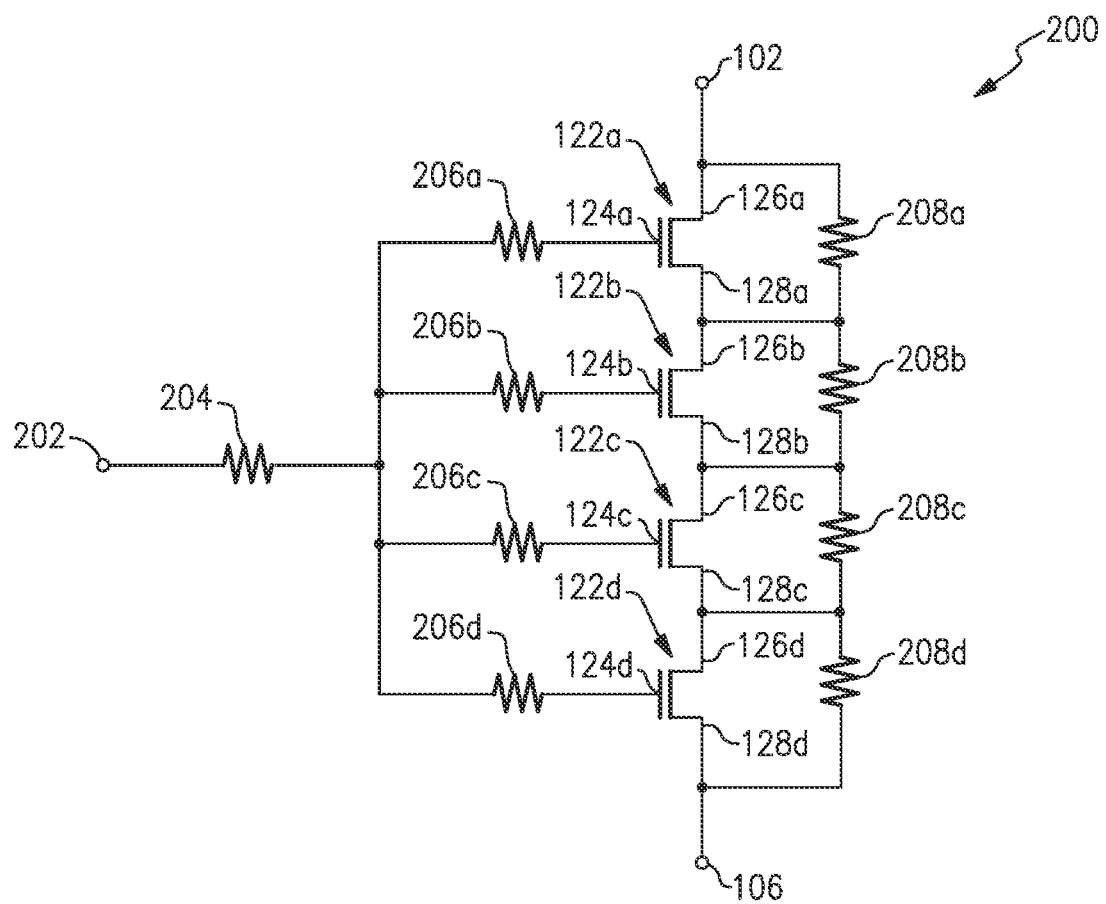
FIG. 2A is a schematic diagram of an example of a transistor-based signal switch.

FIG. 2A illustrates one example of a transistor-based signal switch 200. In one example, the switch 200 may be substantially similar to the shunt switch 120 of FIGS. 1B and 1C, except that the switch 200 includes a control signal input 202 and a common resistor 204 coupled between the control signal input 202 and a plurality of gate resistors 206.

In one example, the plurality of FETs 122 of the switch 200 include a first FET 122a, a second FET 122b, a third FET 122c, and a fourth FET 122d coupled between the signal input 102 and the reference node 106. In other examples, the plurality of FETs 122 may include a different number of FETs. As shown in FIG. 2A, a first gate resistor 206a may be coupled between the common resistor 204 and a gate 124a of the first FET 122a, a second gate resistor 206b may be coupled between the common resistor 204 and a gate 124b of the second FET 122b, a third gate resistor 206c may be coupled between the common resistor 204 and a gate 124c of the third FET 122c, and a fourth gate resistor 206d may be coupled between the common resistor 204 and a gate 124d of the fourth FET 122d.

In some examples, the switch 200 may include a plurality of drain-source resistors 208 coupled in parallel with the plurality of FETs 122 (e.g., with each drain-source resistor coupled between the drain and the source of a respective FET 122). For example, a first drain-source resistor 208a may be coupled in parallel with the first FET 122a, a second drain-source resistor 208b may be coupled in parallel with the second FET 122b, a third drain-source resistor 208c may be coupled in parallel with the third FET 122c, and a fourth drain-source resistor 208d may be coupled in parallel with the fourth FET 122d. In one example, each resistor of the plurality of drain-source resistors 208 may have substantially the same value; however, in other examples, at least one of the drain-source resistors 208 may have a different value.

In certain examples, the switch 200 may be configured to operate in an "ON state" by turning on each FET of the plurality of FETs 122. In one example, when turned on, each FET of the plurality of FETs 122 may provide a conductive signal path having a drain-to-source resistance ($R_{on}$). In some examples, the $R_{on}$ of each FET may be substantially smaller than the value of the corresponding drain-source resistor $R_{ds}$ (e.g., 208a, 208b, etc.). As such, in the ON state of the switch 200, the drain-source resistors 208 may be bypassed to provide a signal path from the signal input 102, through the plurality of FETs 122, to the reference node 106 (e.g., a ground). Likewise, the switch 200 may be configured to operate in an "OFF state" by turning off the plurality of FETs 122 to disconnect the signal path between the signal input 102 and the reference node 106.

In one example, a control signal may be provided from the control signal input 202, through the common resistor 204 and the plurality of gate resistors 206 to turn on each FET of the plurality of FETs 122. In some examples, to turn on each FET of the plurality of FETs 122, the gate voltage of each FET is raised above a gate threshold voltage by charging a gate capacitance. In one example, the gate capacitance of each FET includes a gate-to-drain capacitance, a gate-to-source capacitance, and a gate-to-body capacitance. Once the gate capacitance of a FET is sufficiently charged, the gate voltage may exceed the gate threshold voltage, thus turning the FET on. Likewise, to turn off each FET of the plurality of FETs 122, the gate voltage of each FET is lowered below the gate threshold voltage by discharging the accumulated gate capacitance.

Figure 2B:
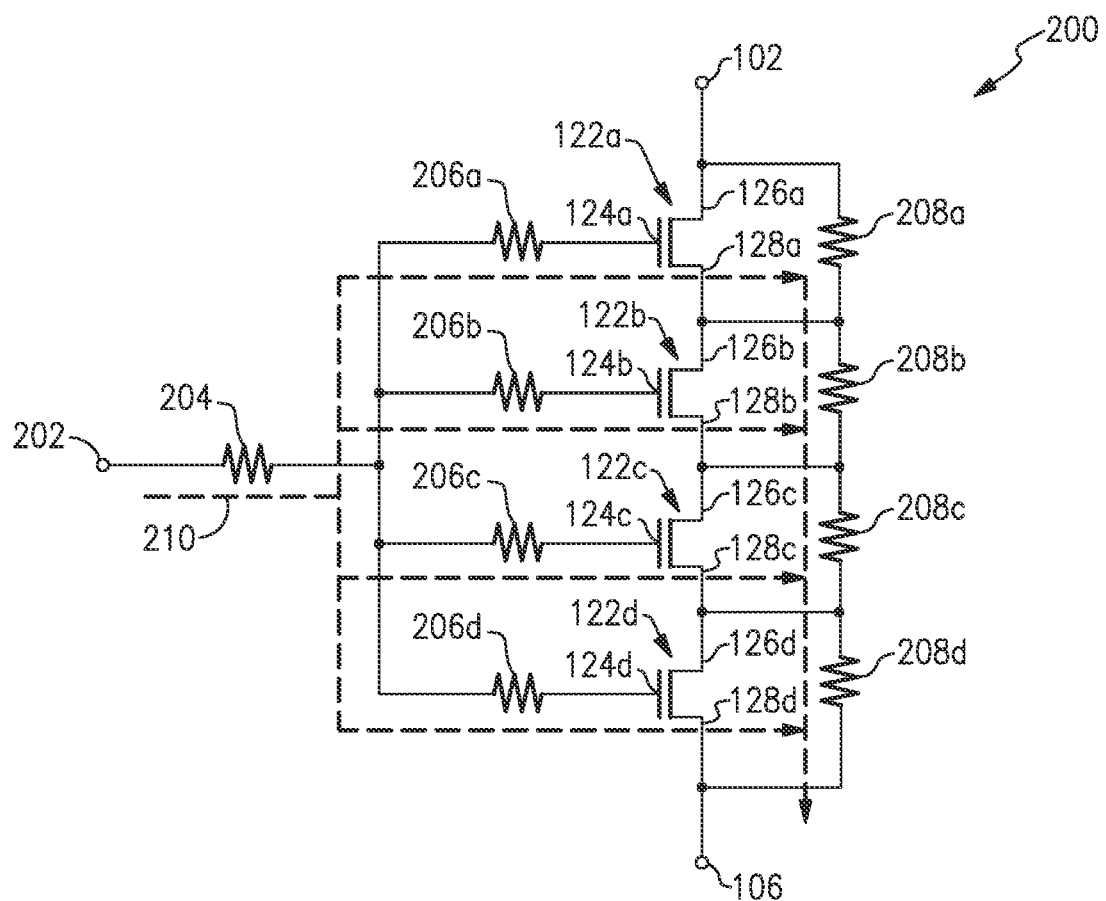
FIG. 2B is a schematic diagram of an example of a transistor-based signal switch.

FIG. 2B illustrates the control operation of the switch 200. As shown, to turn on the switch 200, a control signal 210 may be applied at the control signal input 202. The control signal 210 is then applied to each gate 124 of the plurality of FETs 122 via the common resistor 204 and the respective plurality of gate resistors 206. In one example, current corresponding to the control signal 210 may be provided through the common resistor 204 and the current may then be divided into portions and provided to the gates 124 via the individual gate resistors (e.g., 206a, 206b, etc.). As discussed above, each FET of the plurality of FETs 122 may be turned on by charging the corresponding gate capacitance (e.g., a gate-to-drain capacitance, a gate-to-source capacitance, and/or a gate-to-body capacitance). In some examples, the turn-on switching time of each FET may correspond to an RC time constant defined, at least in part, by the common resistor 204, the corresponding gate resistor (e.g., 206a, 206b, etc.), the corresponding gate capacitance, and the plurality of drain-to-source resistors 208. As such, each FET of the plurality of FETs 122 may experience a different turn-on time (i.e., a different RC time constant).

In one example, the turn-on time of each FET may depend on the FET's position in the plurality of FETs 122. For example, the RC time constant associated with the first FET 122a may include all of the plurality of drain-to-source resistors 208, and the RC time constant associated with the fourth FET 122d may only include the fourth drain-source resistor 208d. As such, the RC time constant associated with the first FET 122a may be larger than the RC time constant associated with the fourth FET 122d, and thus the first FET 122a may have a longer turn-on time than the fourth FET 122d (assuming the signal input 102 is connected to a fairly high impedance at a low frequency (such as a capacitor, an "OFF state" FET, or a high value resistor), and the reference node 106 is connected to a fairly low impedance (such as a ground node, an inductor connected to ground, or a series of "ON state" FETs or switches connected to ground)). Likewise, when the signal input 102 and the reference node 106 are both connected to substantially similar impedances (e.g., in value or order of magnitude), the center FETs (e.g., 122b, 122c) may have longer turn-on times than the first and fourth FETs 122a, 122d.

In some examples, to turn off the switch 200, the gate capacitance of each FET of the plurality of FETs 122 may be discharged. In one example, current may discharge from each FET via the corresponding gate resistor (e.g., 206a, 206b, etc.) and the common resistor 204. In certain examples, the turn-off time of each FET may correspond to the RC time constants discussed above. As such, each FET of the plurality of FETs 122 may experience a different turn-off time. In some examples, the turn-off time of each FET may also depend on the FETs position in the plurality of FETs 122.

In one example, the switch 200 may be configured to distribute an RF voltage applied at the signal input 102 across the plurality of FETs 122 during the OFF state. In some examples, the elements of the switch 200 may function as a voltage divider to distribute the RF voltage across the plurality of FETs 122. For example, the plurality of gate resistors 206, the plurality of drain-source resistors 208, and the parasitic capacitances of the plurality of FETs 122 (e.g., parasitic gate capacitance, drain-to-source capacitance, etc.) may each contribute to the distribution of the RF voltage across the plurality of FETs 122. In some examples, each FET of the plurality of FETs 122 may have substantially similar parasitic capacitances. As such, the values of the plurality of gate resistors 206 and the plurality of drain-source resistors 208 may be selected to achieve a desired voltage distribution for the switch 200. In one example, the desired voltage distribution may be a substantially even distribution across each FET of the plurality of FETs 122; however, in other examples a different voltage distribution may be desired. In some examples, the desired voltage distribution may be selected to prevent the plurality of FETs 122 from entering a breakdown region.

As described above, it may be desirable for RF switches to have a large off resistance ($R_{off}$), and the values of the plurality of gate resistors 206 may contribute to establishing the value of $R_{off}$. In one example, each of the plurality of gate resistors 206 may dissipate a portion of the RF voltage applied to the signal input 102 in the OFF state of the switch 200. In some examples, the portions of the RF voltage dissipated by each of the plurality of gate resistors 206 may depend on the voltage distribution of the switch described above. As such, power dissipation may be taken into consideration when selecting values for the plurality of gate resistors 206 to manage loss in the switch 200.

Figure 2C:
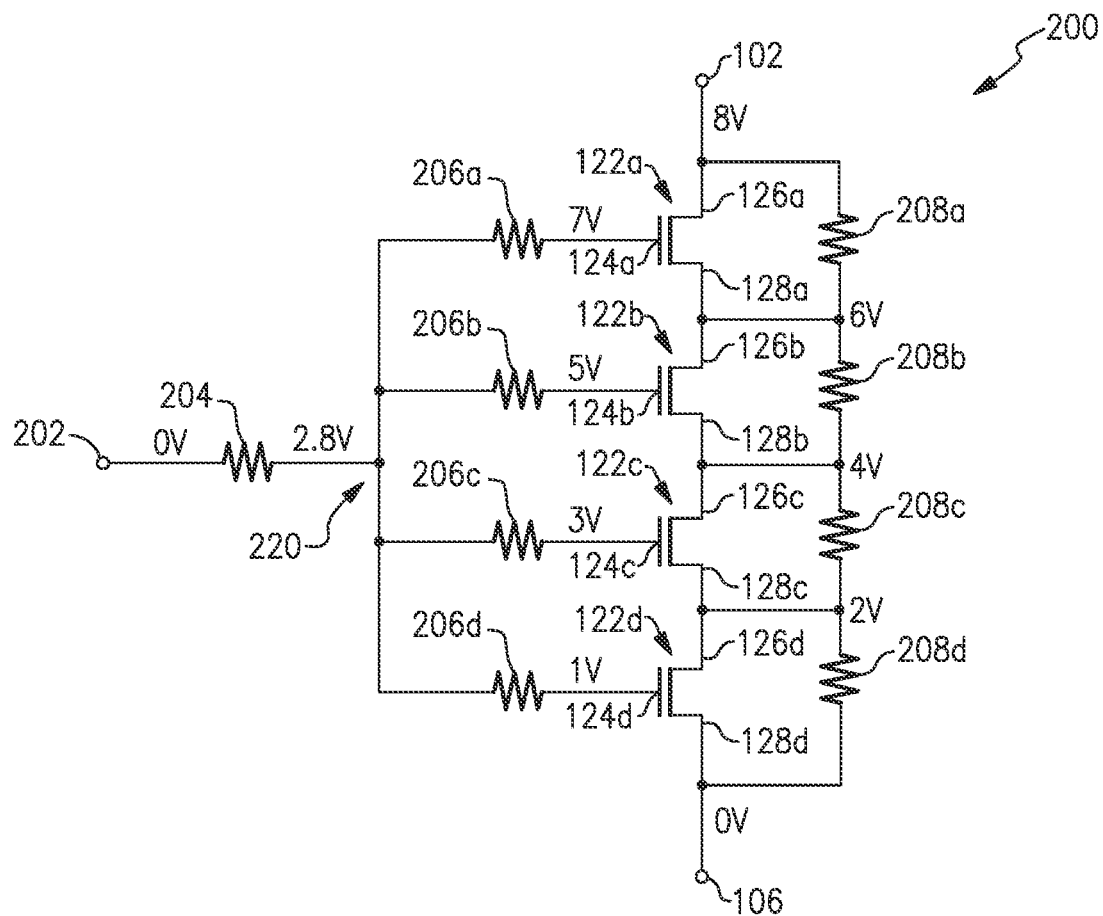
FIG. 2C is a schematic diagram of an example of a transistor-based signal switch.

FIG. 2C illustrates the switch 200 while turned off. In one example, an RF voltage (e.g., 8V) is applied at the signal input 102 and distributed evenly across the plurality of FETs 122. As shown, substantially similar portions of the RF voltage (e.g., 2V) may be distributed across each FET of the plurality of FETs 122. In one example, based on the voltage distribution of the switch 200, a portion of the RF voltage may be present at a common node 220 between each of the plurality of gate resistors 206 and the common resistor 204. In some examples, the power dissipated by each of the plurality of gate resistors 206 may be determined, at least in part, by the voltage differential between each gate 124 of the plurality of FETs 122 and the common node 220. As such, the voltage differential between each gate 124 of the plurality of FETs 122 may depend on the corresponding FETs position in the plurality of FETs 122. For example, the power dissipated by the first gate resistor 206a may correspond to the voltage differential between the gate 124a of the first FET 122a and the common node 220 (e.g., 4.2V). Similarly, the power dissipated by the third gate resistor 206c may correspond to the difference between the voltage at the gate 124c of the third FET 122c (e.g., 3V) and the voltage at the common node 220 (e.g., 2.8V). Being that the voltage differential between the gate 124c of the third FET 124c and the common node 220 is relatively small (e.g., 0.2V), the power dissipated by the third gate resistor 206c is also relatively small. As such, the value of the third gate resistor 206c may be reduced. In some examples, as a result of reducing the value of the third gate resistor 206c, the values of the other gate resistors (e.g., 206a, 206b, 206d) may be adjusted (e.g., increased) to provide an optimally scaled arrangement of gate resistor values. However, reducing RC time constants in this manner can result in increased losses in the RF switch due to the reduced isolation levels.

An improved transistor-based signal switch is provided herein. In at least one embodiment, the transistor-based signal switch may have a variable resistance level between the source of the control signal/control voltage and the gate(s) of the FET(s) of the transistor-based signal switch (the "main" switch) to improve switching speed during transitions of the state of the switch, while maintaining isolation performance during transmission or reception of an RF signal.

In one example of the present disclosure, the variable resistance level may be provided by one or more resistors having a further switch connected in parallel to short the one or more resistors when desired. In particular, this may enable a transistor-based switch assembly to use a high resistance between the gates of the FETs forming the main switch and the voltage driver that applies the control voltage to the gates of these FETs in order to hold the FETs either on or off. This high resistance may prevent leakage of the RF signal that is applied to the main switch (or that is passing through the main switch in the case where the main switch is in an ON state), as well as improving the linearity of the switch. However, this high resistance will correspond to a given RC time constant experienced by each FET of the main switch, which would in turn correspond to a given switching time for charging each FET of the main switch to transition from an OFF state to an ON state, or alternatively for discharging each FET of the main switch to transition from an ON state to an OFF state. By shorting the one or more resistors between the source of the control signal/control voltage and the gate(s) of the FET(s) of the main switch, this RC time constant may be reduced and accordingly a shorter (i.e., faster) switching time may be obtained for transitioning the main switch between the ON and OFF states. As such, it may be desirable in this example to short (i.e., bypass) the one or more resistors, between the source of the control signal/ control voltage and the gate(s) of the FET(s) of the main switch, using the further switch while the main switch is transitioning between the ON and OFF states (i.e., during charging/discharging of the gate(s)) to provide faster switching times. Correspondingly, it may be desirable to open the further switch (such that these one or more resistors are not shorted/bypassed) while the main switch is not transitioning between the ON and OFF states to provide improved linearity and reduced leakage in the main switch.

Figure 3:
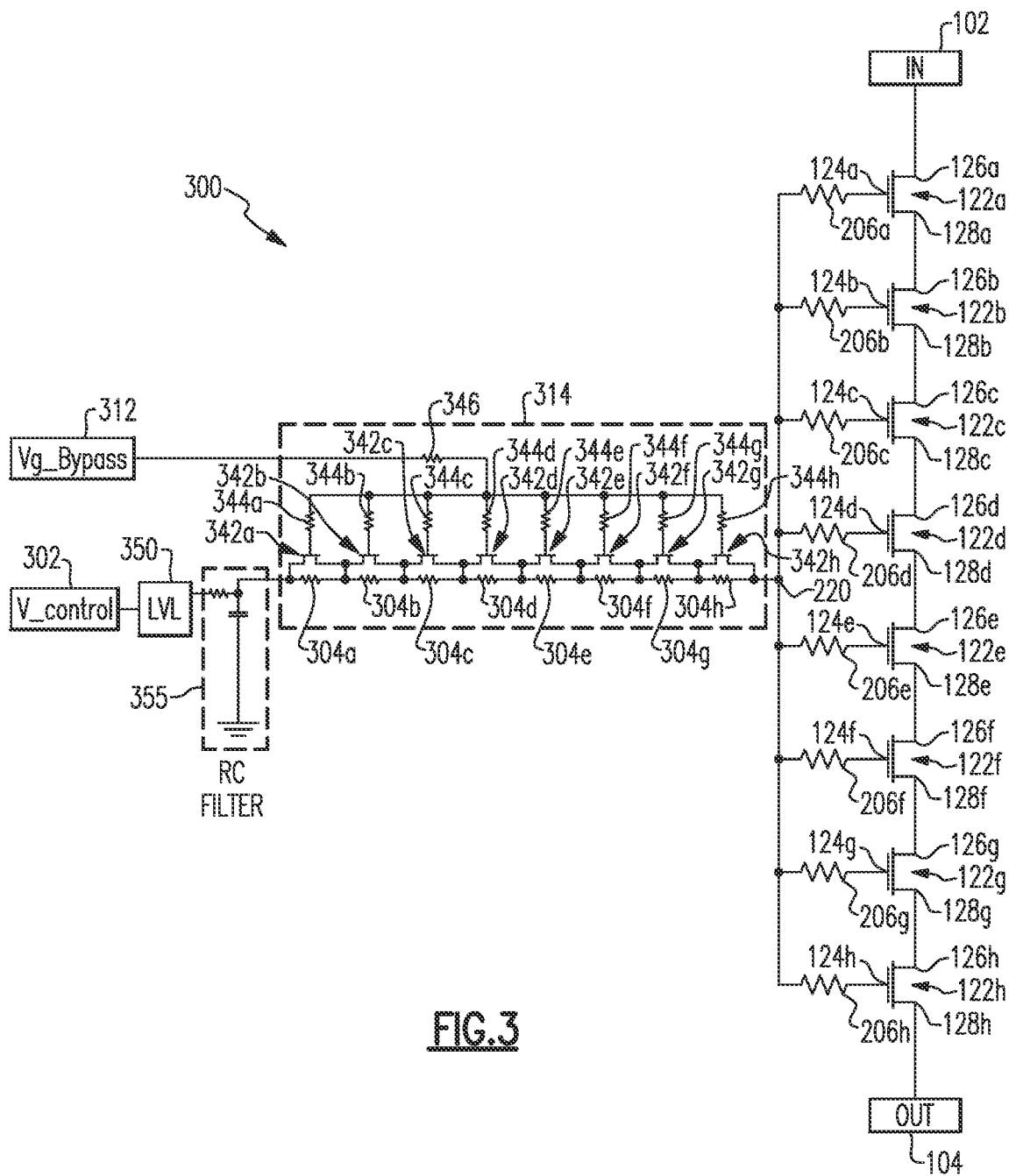
FIG. 3 is a schematic diagram of a switch assembly according to aspects of the present disclosure.

FIG. 3 is a schematic circuit diagram of an example of a transistor-based switch assembly 300 according to aspects of the present disclosure. In one example, the switch assembly 300 may be substantially the same as the switch 200 discussed above, except that the common resistor 204 has been replaced with a bypassable resistance 314 having a bypass control node 312 for controlling the bypassable resistance 314.

In one example, the bypassable resistance 314 comprises a plurality of resistive elements 304 (304a to 304h) connected together in series, and a second switch formed of a second plurality of FETs 342 (342a to 342h) arranged in series. Each FET of the second plurality of series FETs 342 may have a gate, a drain, and a source. By connecting the second switch in parallel to the plurality of resistive elements 304, a signal applied to the bypassable resistance 314 may be communicated through the plurality of resistive elements 304 when the FETs 342 of the second switch are turned off such that the second switch is configured to operate in an OFF state. Conversely, when the FETs 342 of the second switch are turned on such that the second switch is configured to operate in an ON state, the signal applied to the bypassable resistance 314 may bypass the plurality of resistive elements 304 and instead be communicated through a conductive path between the drain of the first FET 342a and the source of the eighth FET 342h.

While eight FETs 342 are illustrated in FIG. 3, it will be appreciated that a different number of FETs 342 may be included in other examples. In particular, the number of FETs 342 may be chosen depending on the design requirements of a given RF circuit, such as the voltage level to be passed through the second switch (e.g., to charge or discharge the gates of the plurality of FETs 112) and the process type selected for the switch circuit. For example, a single FET 342 could be used in one example. Moreover, it is noted that the number of FETs 342 of the second switch is not required to be the same as the number of FETs 122 of the first switch.

In one example, the control signal for operating the second switch may be provided from the bypass control node 312 (Vg_Bypass), through a common resistor 346 and a plurality of gate resistors 344 (344a to 344h) to turn on each FET of the plurality of FETs 342 of the second switch. In some examples, to turn on each FET of the plurality of FETs 342, the gate voltage of each FET is raised above a gate threshold voltage by charging a gate capacitance. In one example, the gate capacitance of each FET includes a gate-to-drain capacitance, a gate-to-source capacitance, and a gate-to-body capacitance. Once the gate capacitance of a FET is sufficiently charged, the gate voltage may exceed the gate threshold voltage, thus turning the FET on. Likewise, to turn off each FET of the plurality of FETs 342, the gate voltage of each FET is lowered below the gate threshold voltage by discharging the accumulated gate capacitance.

While a transistor-based switch comprised of a plurality of MOSFETs has been illustrated in the example of FIG. 3, it will be appreciated that other switch technologies may also be used for this second switch within the context of the present disclosure. In particular, the second switch may comprise one or more junction FETs (JFETs), metal oxide semiconductor FETs (MOSFETs), silicon on insulator (SOI) MOSFETs, gallium arsenide (GaAs) FETs, gallium nitride (GaN) FETs, another type of FET structure, or another switch structure. Furthermore, FETs may be of N-channel or P-channel types, and enhancement or depletion mode types.

In one example, the switch assembly 300 comprises a first switch formed of the plurality FETs 122 (122a to 122h) arranged in series and coupled between the signal input 102 and the signal output 104. While eight FETs 122 are illustrated in FIG. 3, it will be appreciated that a different number of FETs 122 may be included in other examples. In particular, the number of FETs 122 may be chosen depending on the design requirements, such as the operational voltage level that the RF signal to be passed is sitting at and the process type selected for the switch circuit. For example, a single FET 122 could be used in one embodiment.

Each FET of the plurality of series FETs 122 may have a gate 124 (124a to 124h), a drain 126 (126a to 126h), and a source 128 (128a to 128h). As shown in FIG. 3, the drain 126a of the first FET 122a may be coupled to the node of the signal input 102 and the source 128h of the eighth FET 122h may be coupled to the node of the signal output 104. The drain and the source of the other FETs may then be coupled respectively to the source and the drain of the adjacent FETs 122 to form a stack of FETs as shown in FIG. 3.

As shown in FIG. 3, the first gate resistor 206a may be coupled between the common node 220 and the gate 124a of the first FET 122a, the second gate resistor 206b may be coupled between the common node 220 and the gate 124b of the second FET 122b, the third gate resistor 206c may be coupled between the common node 220 and the gate 124c of the third FET 122c, the fourth gate resistor 206d may be coupled between the common node 220 and the gate 124d of the fourth FET 122d, the fifth gate resistor 206e may be coupled between the common node 220 and the gate 124e of the fifth FET 122e, the sixth gate resistor 206f may be coupled between the common node 220 and the gate 124f of the sixth FET 122f, the seventh gate resistor 206g may be coupled between the common node 220 and the gate 124g of the seventh FET 122g, the eighth gate resistor 206h may be coupled between the common node 220 and the gate 124h of the eighth FET 122h.

The control signal for the first switch may be provided by the voltage control source 302 (V_control) in combination with the level shifter 350. In one example, the voltage control source provides a source voltage that may then be adapted by the level shifter 350 to the desired high value positive and/or negative voltages for the control of the first switch. This may include shifting the voltage between a high and a low state to turn on and off each FET of the plurality of FETs 122 of the first switch. In some examples, to turn on each FET of the plurality of FETs 122, the gate voltage of each FET is raised above a gate threshold voltage by charging a gate capacitance. In one example, the gate capacitance of each FET includes a gate-to-drain capacitance, a gate-to-source capacitance, and a gate-to-body capacitance. Once the gate capacitance of a FET is sufficiently charged, the gate voltage may exceed the gate threshold voltage, thus turning the FET on. Likewise, to turn off each FET of the plurality of FETs 122, the gate voltage of each FET is lowered below the gate threshold voltage by discharging the accumulated gate capacitance.

In one example, the switch assembly 300 further includes an RC filter 355 positioned in the path coupling the control signal (provided by the level shifter 350 in combination with the voltage control source 302) and the common node 220. This RC filter 355 may act to filter out noise from the control signal (which may have been generated by the voltage control source 302) before it is coupled to the common node 220 and applied to each of the gates 124 of the plurality of FETs 122. Furthermore, the capacitive nature of the RC filter may act to prevent any high frequency components of the RF signal that may have been communicated across the gates of the FETs 122 from damaging the level shifter 350 and other control signal circuitry. In particular, the RC filter may absorb these high frequency components and act as a short to ground in one example.

As shown in FIG. 3, the bypassable resistance 314 may be coupled between the common node 220 and the level shifter 350 that outputs the control signal for the first switch.

As shown in FIG. 3, the drain of the first FET 342a may be coupled to the level shifter 350 (via the RC filter 355), and the source of the eighth FET 342h may be coupled to the common node 220. In this manner, the control signal for the first switch provided by the voltage control source 302 (V_control) in combination with the level shifter 350 may pass through the bypassable resistance block 314 to the common node 220. From the common node 220, this control signal for the first switch may be applied to the gates 124 of the plurality of FETs 122 of the first switch via the respective gate resistors 206.

As such, when the second switch is configured in the OFF state (the plurality of FETs 342 are turned off by the Vg_Bypass control signal), the series resistance of the plurality of resistive elements 304 may sum to act as a common resistor, similar to the common resistor 204 of the switch 200. This high resistance may prevent leakage of the RF signal that is applied to the main switch (or that is passing through the main switch in the case where the main switch is in an ON state), as well as improving the linearity of the switch.

When the second switch is configured in the ON state (the plurality of FETs 342 are turned on by the Vg_Bypass control signal), the series resistance of the plurality of resistive elements 304 will be bypassed and the V_control control signal will pass through the conductive path of the FETs 342 of the second switch (rather than the plurality of resistive elements 304, which have a higher resistance). This reduces the resistance experienced by the gates 124 of the FETs 122 of the first switch and thus reduces the corresponding RC time constant experienced at the gates 124. Accordingly, by shorting the plurality of resistive elements 304 during a time period in which it is desired to either charge or discharge the gates 124 of the FETs 122 of the first switch (in order to transition the first switch between the ON and OFF states), a shorter (i.e., faster) switching time may be obtained for effecting this transition.

The resistive elements 304 of the bypassable resistance block 314 are shown in FIG. 3 as being coupled in parallel with the plurality of FETs 342 with each resistive element 304 coupled between the drain and the source of a respective FET 342. In this manner, the plurality of resistive elements may act as drain-source resistors for the FETs 342 of the second switch as well as acting as a common resistor for the gates 124 of the FETs 122 of the first switch. Accordingly, the plurality of resistive elements may perform DC biasing in the FETs 342 of the second switch.

While a plurality of resistive elements 304a to 304h are illustrated in FIG. 3, it will be appreciated that present disclosure is not limited to such a configuration and a different number of resistive elements may be provided. For example, a single resistor 304 may be provided in parallel with the second switch in one embodiment. Moreover, the number of resistive elements 304 is not required to match the number of FETs 342 present in the second switch.

While not shown in FIG. 3, in some examples, the first switch of the switch assembly 300 may further include a plurality of drain-source resistors 208 (see FIGS. 2A, 2B, and 2V) coupled in parallel with the plurality of FETs 122 (e.g., with each drain-source resistor coupled between the drain and the source of a respective FET 122). Accordingly, the plurality of drain-source resistors 208 may perform DC biasing in the FETs 122 of the first switch. In one example, each resistor of the plurality of drain-source resistors 208 may have substantially the same value; however, in other examples, at least one of the drain-source resistors 208 may have a different value to one or more of the other drain-source resistors 208.

In one example, two or more switch assemblies 300 may be coupled together such that the signal output 104 of a first switch assembly is coupled to the input of a second switch assembly etc. In this manner the plurality of FETs of the coupled switches may be considered to be split into two more subgroups, with separate control circuitry having a bypassable common resistance for each subgroup. For example, instead of a switch having a stack of eight FETs, two switches may be provided with each switch having a stack of four FETs and each switch having corresponding control circuitry. This may enable even faster switching times in some embodiments.

Figure 4:
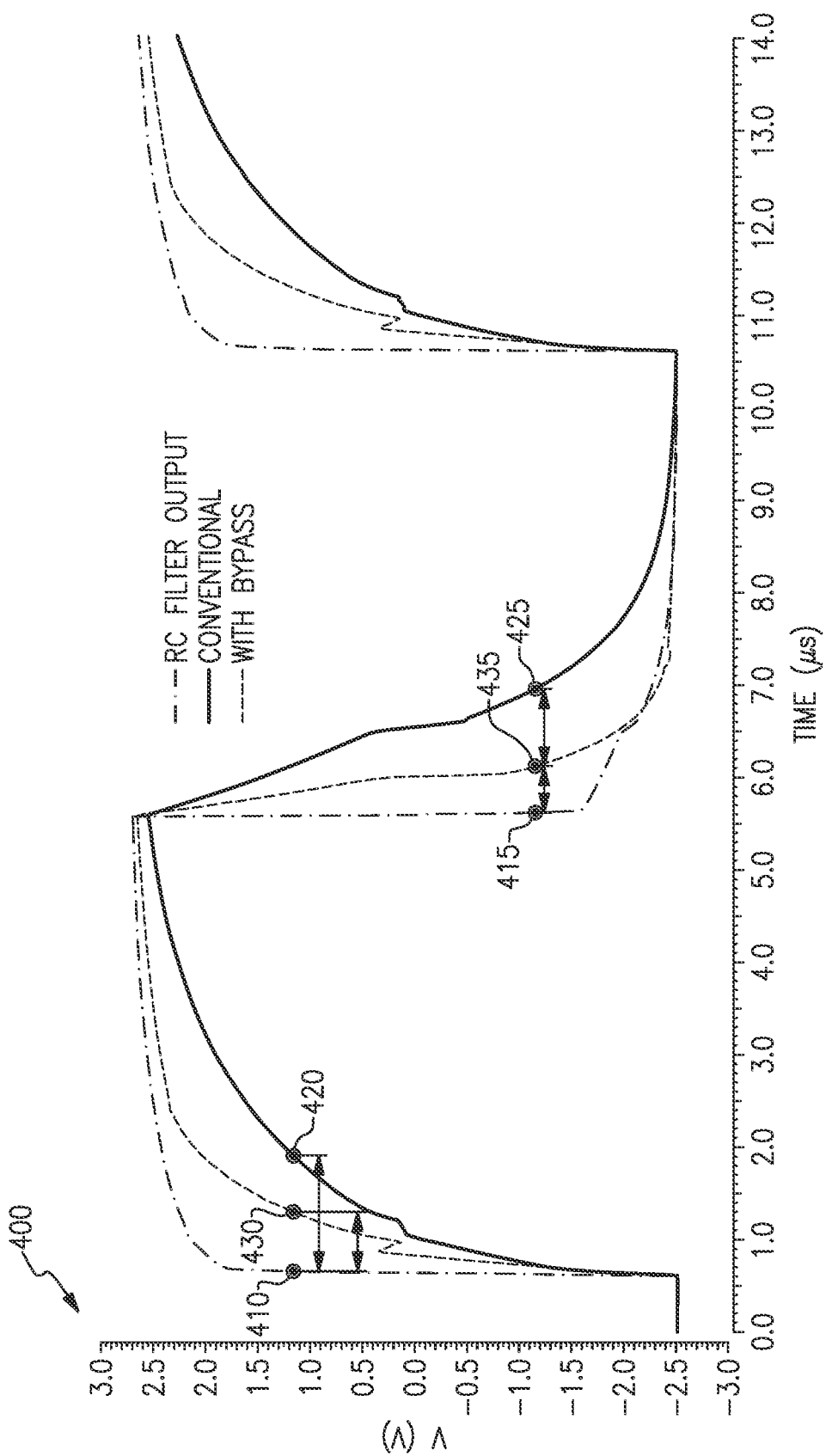
FIG. 4 is a graph illustrating comparative simulated performance characteristics for an example transistor-based switch assembly according to aspects of the present disclosure.

FIG. 4 is a graph 400 illustrating the comparative simulated performance characteristics for an example transistor-based switch assembly according to aspects of the present disclosure. The graph 400 illustrates the voltage level (in volts) over time (in microseconds) to illustrate the speed at which the gates 124 of the first plurality of FETs 122 are charged and discharged by the control signal voltage output by the level shifter 350. A first trace illustrates the voltage over time as measured at the output of the RC filter 355, i.e., the voltage being output by the level shifter 350. A second trace illustrates the gate voltage over time as measured at a gate 124 of a FET 122 of the plurality of FETs of the first switch with the control signal voltage being applied to the gate 124 via the common resistor 204 or 304 and the gate resistor 206. A third trace illustrates the gate voltage over time as measured at a gate 124 of a FET 122 of the plurality of FETs of the first switch with an arrangement in accordance with the above disclosure, whereby the control signal voltage is applied to the gate 124 via the bypass channel of the FETs 342 of the second switch and the gate resistor 206.

Points 410, 420, and 430 illustrate, in the respective traces, the point in time that the first switch transitions from the OFF state to the ON state, i.e., the point at which the voltage at the gate 124 of the FET 122 of the first switch reaches the gate threshold voltage to turn the FET 122 on during charging of the gate 124. As can be seen from FIG. 4, in some examples an approximately 50% improvement in the speed at which the FET 122 turns on can be realized by using the second switch of the present disclosure to bypass the resistance 304 that acts as a common resistor for the gate 124 of the FET 122 during charging of the gate 124. Once the gate voltage of the gate 124 has exceeded the gate threshold voltage, the FET 122 will effectively be on; however, further increases in the gate voltage act to reduce the losses in the FET of the RF signal to be communicated between the signal input 102 and the signal output 104.

Similarly, points 415, 425, and 435 illustrate, in the respective traces, the point in time that the first switch transitions from the ON state to the OFF state, i.e., the point at which the voltage at the gate 124 of the FET 122 of the first switch drops below the gate threshold voltage to turn the FET 122 off during discharging of the gate 124. Again, as can be seen from FIG. 4, in some examples an approximately 50% to 60% improvement in the speed at which the FET 122 turns off can be realized by using the second switch of the present disclosure to bypass the resistance 304 that acts as a common resistor for the gate 124 of the FET 122 during discharging of the gate 124. Once the gate voltage of the gate 124 has dropped below the gate threshold voltage, the FET 122 will effectively be off.

In operation of the switch assembly 300, the FETs 122 of the first switch may initially be turned on, such that an RF signal received at the signal input 102 is communicated to the signal output 104, and the FETs 342 of the second switch may be turned off, such that signal path of the voltage control signal from the level shifter 350 for the first switch passes through the plurality of resistive elements 304 forming a common resistor. When it is desired to transition the first switch from the ON state to the OFF state, such that any RF signal received at the signal input 102 is disconnected from the signal output 104, a control signal Vg_Bypass may be applied at the bypass control node 312. This Vg_Bypass control signal may then be applied to each gate of the plurality of FETs 342 via the common resistor 346 and the respective plurality of gate resistors 344. In one example, current corresponding to the Vg_Bypass control signal may be provided through the common resistor 346 and the current may then be divided into portions and provided to the gates via the individual gate resistors (e.g., 344a to 344h). This Vg_Bypass control signal may be a positive voltage control signal. As discussed above, each FET of the plurality of FETs 342 may thus be turned on substantially simultaneously by charging the respective gate capacitances.

Once each FET of the plurality of FETs 342 has been turned on, the V_control control signal applied by the level shifter 350 may be coupled to the gates 124 of the plurality of FETs 122 via the conductive path of the FETs 342 and the respective gate resistors 206 (rather than via the common resistance of the plurality of resistive elements 304 and the respective gate resistors 206). This V_control control signal may be a negative voltage control signal. In this manner, the resistance between the level shifter 350 and the gates 124 of the plurality of FETs 122 may be reduced and thus the corresponding RC time constant experienced at the gates 124 may also be reduced. Accordingly, the gate capacitance of each FET of the plurality of FETs 122 may be discharged from each FET 122 at an increased speed to transition the first switch from the ON state to the OFF state with a faster switching speed.

When the gate capacitance of each FET of the plurality of FETs 122 has been discharged such that the respective gate voltages fall below the gate threshold voltage, the control signal Vg_Bypass applied by the bypass control node 312 to each gate of the plurality of FETs 342 may be configured to discharge the gate capacitance of the gate of each FET of the plurality of FETs 342. This Vg_Bypass control signal may be a negative voltage control signal. Each FET of the plurality of FETs 342 may thus be turned off such that the V_control control signal applied by the level shifter 350 is instead coupled to the gates 124 of the plurality of FETs 122 via the common resistance of the plurality of resistive elements 304 and the respective gate resistors 206. This increases the resistance seen by each gate 124 of the plurality of FETs 122 of the first switch and thus reduces any leakage of the RF signal applied to the first switch as well as improving the linearity of the first switch.

Similarly, to transition the switch assembly 300 from the OFF state to the ON state, such that any RF signal received at the signal input 102 is connected to the signal output 104, a control signal Vg_Bypass may be applied at the bypass control node 312. This Vg_Bypass control signal may then be applied to each gate of the plurality of FETs 342 via the common resistor 346 and the respective plurality of gate resistors 344. In one example, current corresponding to the Vg_Bypass control signal may be provided through the common resistor 346 and the current may then be divided into portions and provided to the gates via the individual gate resistors (e.g., 344a to 344h). This Vg_Bypass control signal may be a positive voltage control signal. As discussed above, each FET of the plurality of FETs 342 may thus be turned on substantially simultaneously by charging the respective gate capacitances.

Once each FET of the plurality of FETs 342 has been turned on, the V_control control signal applied by the level shifter 350 may be coupled to the gates 124 of the plurality of FETs 122 via the conductive path of the FETs 342 and the respective gate resistors 206 (rather than via the common resistance of the plurality of resistive elements 304 and the respective gate resistors 206). In this manner, the resistance between the level shifter 350 and the gates 124 of the plurality of FETs 122 may be reduced and thus the corresponding RC time constant experienced at the gates 124 may also be reduced. Accordingly, the gate capacitance of each FET of the plurality of FETs 122 may be charged at each FET 122 at an increased speed to transition the first switch from the OFF state to the ON state with a faster switching speed.

When the gate capacitance of each FET of the plurality of FETs 122 has been charged such that the respective gate voltages reaches or exceeds the gate threshold voltage, the control signal Vg_Bypass applied by the bypass control node 312 to each gate of the plurality of FETs 342 may be configured to discharge the gate capacitance of the gate of each FET of the plurality of FETs 342. This Vg_Bypass control signal may be a negative voltage control signal. Each FET of the plurality of FETs 342 may thus be turned off such that the V_control control signal applied by the level shifter 350 is instead coupled to the gates 124 of the plurality of FETs 122 via the common resistance of the plurality of resistive elements 304 and the respective gate resistors 206. This increases the resistance seen by each gate 124 of the plurality of FETs 122 of the first switch and thus reduces any leakage of the RF signal coupled through first switch between the input 102 and the output 104 as well as improving the linearity of the first switch.

One, usually unwanted, property of transistors that can slow down switching assemblies is parasitic capacitance. This is a capacitance formed between the gate of a transistor and either or both of the drain or source. Parasitic capacitances can slow down switching assemblies because a potential difference between the gate and either or both of the source and the drain causes an amount of charge to accumulate at the source and the drain which, during switching of the transistor, is released. This partially negates the initial current flowing through the transistor and so will initially reduce the throughput current from the source to the drain of the transistor. This is known as the clock feedthrough effect.

Figure 9:
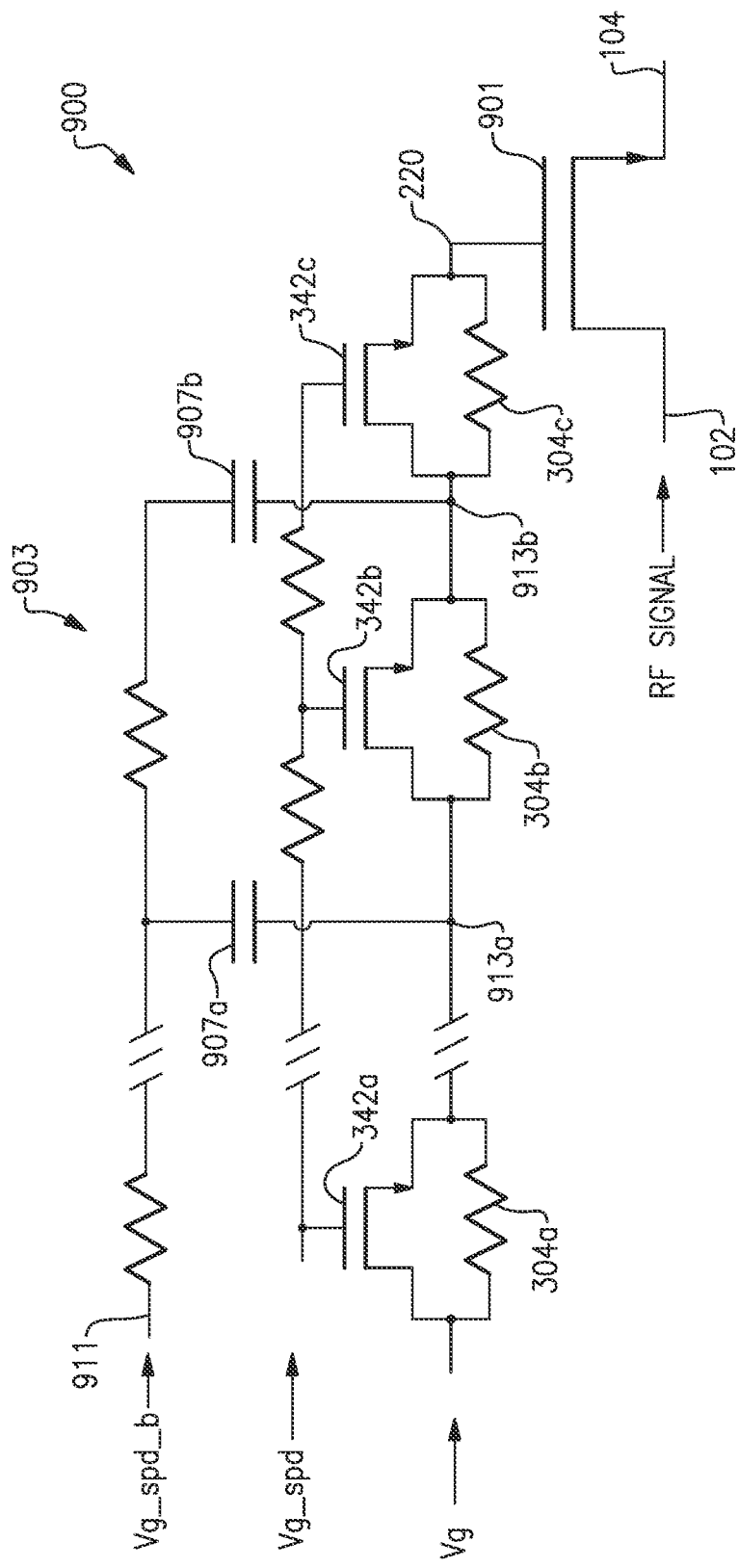
FIG. 9 is a schematic diagram of a switch assembly according to aspects of the present disclosure.

FIG. 9 illustrates a switching assembly 900 that may address this problem and others, in part at least partially overcoming the clock feedthrough effect. The switching assembly 900 of FIG. 9 is similar to that of FIG. 3, and aspects that are similar or the same may not be discussed again in detail. Instead, the reader is referred back to the relevant discussion above.

Switching assembly 900 comprises a first switch 901 and a second switch 903. The first switch 901 has an input node 102 and an output node 104, and selectively passes a radio frequency signal from the input node 102 to the output node 104. The first switch 901 may be a transistor, as illustrated, or an arrangement of transistors (and possibly other components, such as resistors and resistive elements), such as illustrated in FIGS. 1-2. The first switch 901 may be the same as the first switch of FIG. 3. The first switch 901 is driven by a first control signal received at a common node 220, and the second switch 903 selectively passes the first control signal from a first control node to the common node 220. This first control signal is represented as Vg in FIG. 9.

The second switch 903 may be the same as the second switch 342 described with respect to FIG. 3, with the addition of the capacitive components 911 and associated circuitry as will be described with respect to FIG. 9. The second switch 903 is driven by a second control signal, represented by Vg_spd in FIG. 9.

The second switch 903 of FIG. 9, as illustrated, comprises a plurality of transistors 342 and resistive elements 304, as well as capacitive components 907. The transistors 342 are arranged in series between the first control node and the common node 220. The plurality of resistive elements 304 are also arranged in series between the first control node and the common node 220 and in parallel with the plurality of transistors. As can be seen, each transistor 342 has a corresponding resistive element 304 that it can selectively bypass. That is, each transistor 342 has a corresponding resistive element 304 arranged in parallel with it, i.e., connected across the source and drain of the transistor 342. For example, transistor 342a can selectively bypass resistive element 304a, transistor 342b can selectively bypass resistive element 304b, and transistor 342c can selectively bypass resistive element 304c. Together, the resistive elements 304 form a common resistor. This is substantially the same arrangement of transistors 342 and resistive elements 304 as illustrated in FIG. 3.

However, unlike FIG. 3, the second switch 903 of FIG. 9 further comprises a plurality of capacitive components 907. These capacitive components 907 are arranged between the transistors 342. Specifically, between each transistor-resistor pair an intermediate node 913 is defined. As shown in FIG. 9, between transistor the 342a/resistor 304a pair and the transistor 342b/resistor 304b pair, intermediate node 913a is defined. Similarly, between the transistor 342b/resistor 304b pair and the transistor 342c/resistor 304c pair, intermediate node 913b is defined. A capacitive component 907 is provided for each intermediate node 913, and is coupled between a capacitive node 911 and the intermediate node 913. For example, capacitive component 907a is provided between capacitive node 911 and intermediate node 913a.

During operation, a signal is applied at capacitive node 911, Vg_spd_b, which causes a potential difference to exist across the capacitive components 907. This causes charge to accumulate either side of the capacitive component 907 (e.g., on each plate of a capacitor, when the capacitive component 907 is a capacitor). Similarly, a parasitic capacitance is formed between the gate and each of the source and drain in the transistors 342 as described above. This causes charges to accumulate at the sources and drains of the transistors 342 (as well as at the gates). The capacitive components 907 and the signal, Vg_spd_b, controlling them are configured such that the charge that accumulates on the side of the capacitive components 907 connected to the intermediate nodes 913, and hence to the sources and drains of the transistors 342, is of an opposite sign to the charge that accumulates at the sources and drains of the transistors 342. That is, if a positive charge accumulates at the sources and drains of the transistors 342, a negative charge accumulates at the connected side of the capacitive components 907; whereas if a negative charge accumulates at the sources and drains of the transistors 342 then a positive charge accumulates at the connected side of the capacitive components 907. The sign of the charge accumulating in the transistors will depend upon the type of transistor used, for example, NMOS transistors will accumulate a negative charge. The signal applied at capacitive node 911, Vg_spd_b, can be generated by using an inverter to invert the second control signal Vg_spd.

When the transistors 342 are switched, the accumulated charges are released, and these can cause a drop in initial current flowing through the transistors 342 as described above. However, in the switching assembly 900 of FIG. 9, the voltage at the capacitive node 911 is varied at the same time as the transistors are opened such that the capacitors 907 also release their accumulated charges at the same time as the transistors 342. Being of an opposite sign, the charge released from the capacitive components 907 at least partially negates the accumulated charge released by the transistors 342. This means that the initial throughput current is not reduced as severely, or at all, due to the charges released due to the parasitic capacitance of the transistors 342.

Preferably, the charge released by the capacitive component 907 is equal or approximately equal (and opposite) to the sum of the charges released by the two connected transistors 342 at the same intermediate node 913. This is achieved by having the sum of parasitic capacitances of transistors 342 at a given intermediate node 913 equal or approximately equal the capacitance of the capacitive component 917 at this intermediate node. For example, the sum of parasitic capacitance between the gate of transistor 342b and the drain of transistor 342b with the parasitic capacitance between the gate of transistor 342c and the source of transistor 342c (both connected to intermediate node 913b) is preferably equal or approximately equal to the capacitance of capacitive component 917b (also connected to intermediate node 913b). In this manner, the accumulated charge released into intermediate node 913b from the drain of transistor 342b and the source of transistor 342c when the transistors 342b, 342c are switched is at least partially offset by accumulated charge released into intermediate node 913b from capacitive component 917b.

The charge accumulated and released by the capacitive components 907 can be tailored based on a number of factors, according to the known principles in the art. For example, parameters that can be modified to provide the desired capacitance, and hence the desired accumulation of charge, include the voltage difference applied across the capacitive component, the size of the capacitive component, the distance between plates of the capacitive component, the materials of the capacitive component and between the plates of the capacitive component, and the like.

In some examples, the capacitive components are capacitors, though they can be implemented as any component that can provide the desired capacitance as described above. In particular, in some examples, the capacitive components are transistors. These transistors have one side, e.g., the gate, connected to the capacitive node. The source and drain are then both connected to the same intermediate node. In other words, the source and drain are connected together. This produces a capacitance between the gate and the source and between the gate and the drain.

Figure 5:
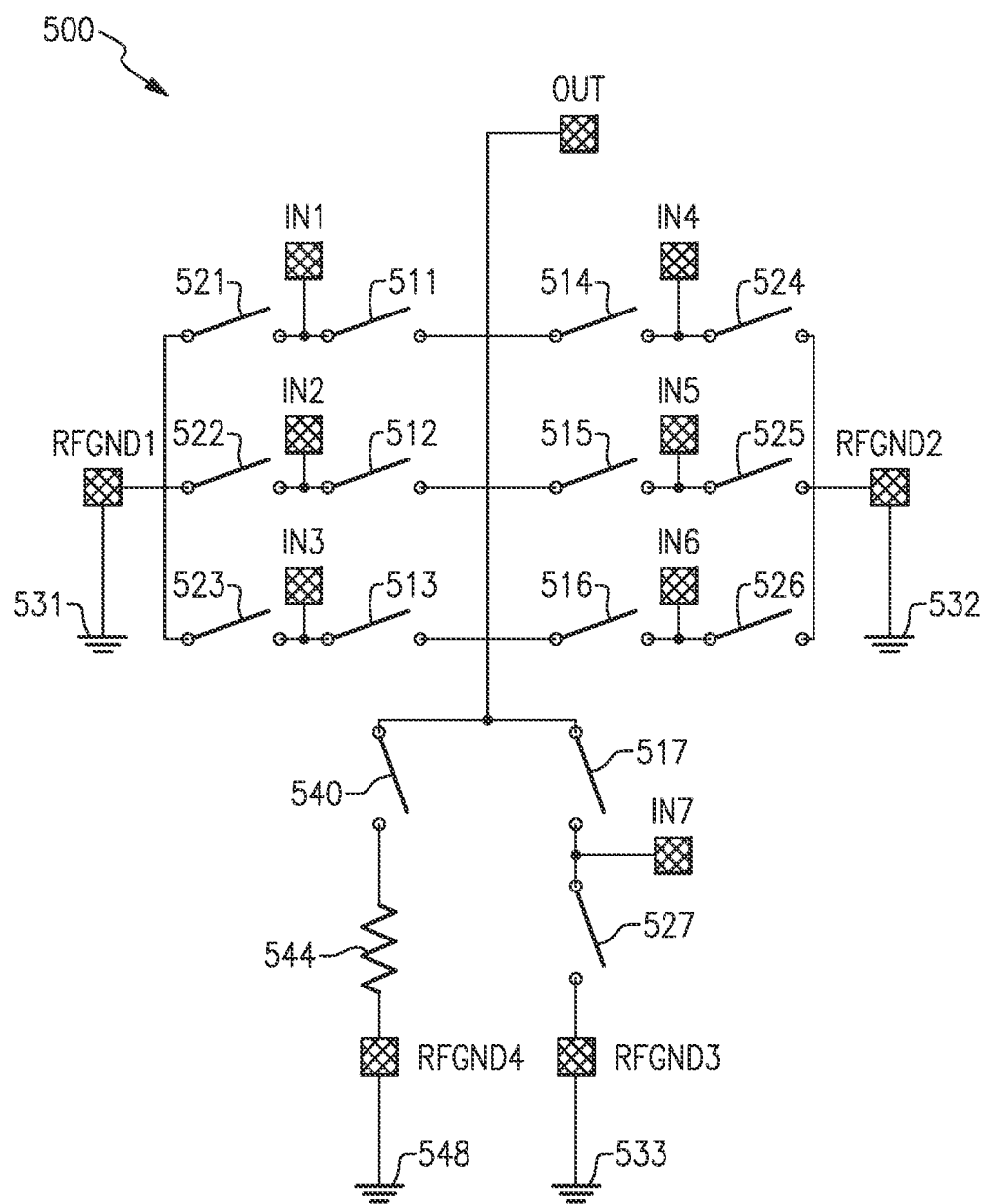
FIG. 5 is a schematic diagram of an antenna switch according to aspects of the present disclosure.

It will be appreciated that switch assemblies in accordance with the present disclosure may be implemented in various parts of the RF signal chain. For example, the switch assemblies 300, 900 may form part of an antenna switch module (ASM) for connecting one of a plurality of RF signals to one or more RF antennas. FIG. 5 is a schematic diagram of an antenna switch 500 according to aspects of the present disclosure. The antenna switch 500 comprises seven RF inputs (IN1, IN2, IN3, IN4, IN5, IN6, and IN7) and one RF output OUT. The RF output OUT may be coupled to a single RF antenna, alternatively it may be connected to a further switch for selecting one of a plurality of RF antennae. The seven RF inputs may be coupled to a respective set of RF signals, for example RF signals corresponding to different RF frequency bands for transmission in a multi-band device. Each RF input may have a corresponding switch assembly (511, 512, 513, 514, 515, 516, 517) configured to connect or disconnect the respective RF input to/from the RF output OUT. The switch assemblies 300, 900 of the present disclosure may be implemented for one or more of the switches 511, 512, 513, 514, 515, 516, and/or 517 to provide improved switching times in the antenna switch 500.

Typically, an RF signal from one RF input will be connected to the RF output OUT at a given point in time while the remaining RF inputs are disconnected from the RF output OUT. While an RF input is disconnected from the RF output OUT, the RF signal applied to the that RF input will preferably be shorted to a ground such that the applied RF signal is in isolation mode. For example, a shunt switch 521 may be provided for shorting IN1 to a node RFGND1 coupled to a ground 531. Similarly, IN2 and IN3 may be coupled to shunt switches 522 and 523 respectively for shorting IN2 and IN3 to the ground 531 of the node RFGND1. In a similar manner, in the example of FIG. 5, IN4, IN5, and IN6 are respectively provided with shunt switches 524, 525, and 526 for selectively coupling them to node RFGND2 so that their RF signals are shorted to a ground 532. Furthermore, IN7 is illustrated as coupled to a shunt switch 527 for selectively coupling IN7 to node RFGND3 to short to a ground 533. Finally, if none of the RF inputs are coupled to the RF output OUT at a given point in time (e.g., the RF output is idle) then the RF output OUT may be coupled to a node RFGND4 by a shunt switch 540 to short the RF output to a ground 548. Optionally, a termination resistor 544 may be coupled in the path between the shunt switch 540 and the ground 548 to provide a given impedance while the RF output is idle.

The shunt switches 521, 522, 523, 524, 525, 526, 527 are designed to short any applied signal to a ground and accordingly they may be configured to be smaller switches having increased losses (since the signal is simply being shorted to ground) and having smaller RC time constants (due to the smaller switch capacitance). However, in certain implementations it may still be desirable to implement a switch assembly 300, 900 in accordance with the present disclosure in one or more of the shunt switches 521, 522, 523, 524, 525, 526, and 527. This may be, for example, if the size of the shunt switch is desired to be increased so that it can handle high voltage level electrostatic discharges etc. If the switch assembly 300, 900 is being implemented in a shunt switch, then the output 104 may be configured to be a reference node (e.g., a ground or neutral).

Alternatively, the switch assembly 300, 900 may form part of a band select switch for connecting the broadband output of a power amplifier to one of a plurality of filter paths for frequency band specific processing of the RF signal in a similar manner.

Figure 6:
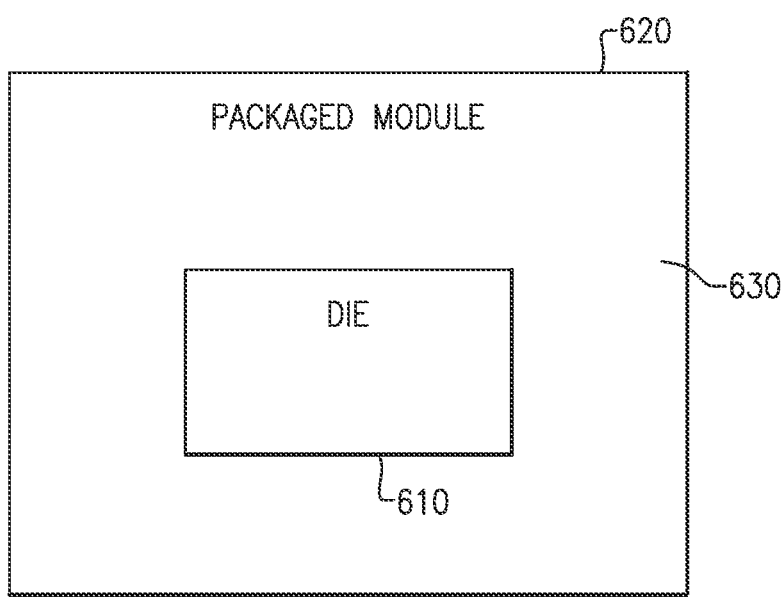
FIG. 6 is a die implemented in a packaged module having one or more features according to aspects of the present disclosure.

FIG. 6 is a die 610 implemented in a packaged module 620. Such a packaged module can include a packaging substrate 630 configured to receive a plurality of components. In one example, the packaging substrate may be configured to receive one or more switch assemblies having one or more features described herein. In one example the packaged module 620 may be a front end module. In some examples, the packaging substrate 630 may be configured to receive further components such as an RF power amplifier (PA), one or more RF filters, and/or a low noise amplifier (LNA). The packaged module may be implemented in a single-sided or double-sided molded package.

The module may further include connectivity from the transistor-based signal switch assembly 300, 900 to the exterior of the packaging to provide signal interconnections, such as input port connections (e.g., signal input 102), output port connections (e.g., signal output 104), reference port connections (e.g., reference node 106), control input connections (e.g., control inputs 302 and 312), etc. Certain examples may have multiple connections to accommodate access to various individual components in the module. The various connections may be provided in part by wire bonds or solder bumps, for example, and may include multiple electrical connections where appropriate.

Embodiments of the transistor-based signal switch assemblies 300, 900 disclosed herein, optionally packaged into a module, may be advantageously used in a variety of electronic devices. General examples of an electronic device may include a circuit board having numerous modules mounted thereon. The circuit board may have multiple layers and may include circuit elements and interconnections in the layers and/or mounted on the surface of the circuit board. Each of the modules may have a multi-layer substrate within and upon which there may also be various circuit elements and interconnections. Additionally, the modules may further include dies, each of which may have multiple layers and include various circuit elements and interconnections. A transistor-based signal switch assembly in accord with aspects and embodiments disclosed herein may be implemented within, among, or across any of the layers of the various structures, e.g., circuit board, substrates, and dies, as part of an electronic device, such as a smart-phone, wireless tablet, laptop computer, smart device, hand-held wireless device with or without phone functionality, router, cable modem, wireless access point, etc.

As described above, an improved transistor-based signal switch assembly is provided herein. In at least one embodiment, the transistor-based signal switch assembly may have a bypassable common resistor for providing an improved switching speed. As such, aspects and embodiments of the RF switch assembly described above may be advantageously used in wireless devices to support, for example, 3G, 4G, LTE, and 5G wireless communications.

Figure 7:
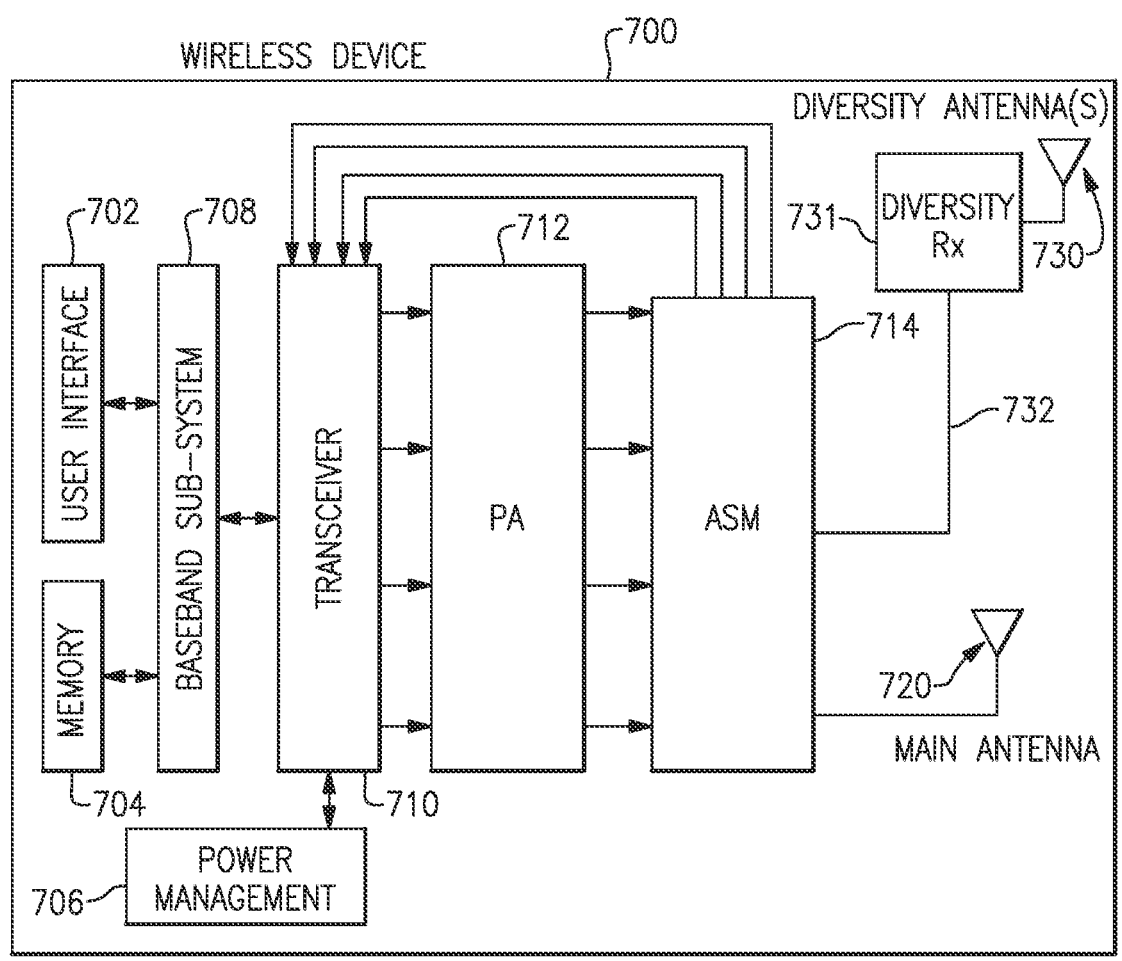
FIG. 7 depicts an example wireless device having one or more features according to aspects of the present disclosure.

FIG. 7 depicts an example wireless device 700 having one or more advantageous features described herein. In the example of FIG. 7, the power amplifier is depicted in a PA module 712; however, it will be understood that such power amplifiers can be implemented in one or more functional blocks, one or more devices such as die or modules, etc. Such power amplifiers can receive their respective RF signals from a transceiver 710 that can be configured and operated to generate RF signals to be amplified and transmitted, and to process received signals. The transceiver 710 is shown to interact with a baseband sub-system 708 that is configured to provide conversion between data and/or voice signals suitable for a user and RF signals suitable for the transceiver 710. The transceiver 710 is also shown to be connected to a power management component 706 that is configured to manage power for the operation of the wireless device 700. Such power management can also control operations of the baseband sub-system 708 and other components of the wireless device 700.

The baseband sub-system 708 is shown to be connected to a user interface 702 to facilitate various input and output of voice and/or data provided to and received from the user. The baseband sub-system 708 can also be connected to a memory 704 that is configured to store data and/or instructions to facilitate the operation of the wireless device, and/or to provide storage of information for the user.

In the example of FIG. 7, an antenna switch module (ASM) 714 can facilitate, for example, multi-band multi-mode operation of the wireless device 700. One or more amplified RF signals may be provided to the ASM 714, and the ASM 714 can route the amplified RF signal(s) to one or more antennas. The PAs 712 can receive corresponding unamplified RF signal(s) from the transceiver 710 that can be configured and operated in known manners.

In the example of FIG. 7, a diversity receive (DRx) module 731 can be implemented between one or more diversity antennas (e.g., diversity antenna 730) and the front-end module. Such a configuration can allow an RF signal received through the diversity antenna 730 to be processed (in some embodiments, including amplification by an LNA) with little or no loss of and/or little or no addition of noise to the RF signal from the diversity antenna 730. Such processed signal from the DRx module 740 can then be routed to the front-end module through one or more signal paths. In some embodiments, the wireless device 700 may or may not include the foregoing DRx functionality.

In the example of FIG. 7, a plurality of antennas can be configured to, for example, facilitate transmission of RF signals from the PA module 712. In some embodiments, receive operations can also be achieved through some or all of the antennas.

Another aspect of the present disclosure is directed to a method of designing a switch for a radio frequency signal switch assembly according to aspects of the present disclosure. FIG. 8 is a flowchart 800 of an example of such a method. At a step 810, the method includes arranging a first switch having a first plurality of transistors coupled between a first node and a second node, each transistor of the first plurality of transistors having a gate, a drain, and a source, each gate of the first plurality of transistors being coupled to a common node, the first node coupled to an input of the switch assembly, and the second node coupled to an output of the switch assembly. At step 820, the method includes arranging a common resistor coupled between a first control node and the common node, and arranging a second switch coupled between the first control node and the common node in parallel to the common resistor; the second switch having a second plurality of transistors connected in series between the control node and the common node, one of the plurality of intermediate nodes being defined between each series connected pair of transistors, each transistor of the second plurality of transistors having a gate coupled to the second control node; and a plurality of capacitive components, one capacitive component being connected between each intermediate node and the capacitive node, wherein a voltage at the capacitive node is configured to be varied inversely with a voltage at the second control node such that, at each intermediate node, the capacitive component is configured to accrue an opposite charge to the transistors.

Then at step 830, the method includes controlling the second switch to be in an ON state such that a first control signal received by the first control node bypasses the common resistor between the first control node and the common node during a period in which the first switch is transitioning between an ON state and an OFF state. At step 840 the method includes controlling the second switch to be in an OFF state such that the first control signal is communicated to the common node via the common resistor during a period in which the first switch is not transitioning between an ON state and an OFF state.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A switching component for use in a switch assembly, the switching component comprising:

a first control node, a common node, a plurality of intermediate nodes, a second control node, and a capacitive node;

a plurality of transistors connected in series between the first control node and the common node, each respective intermediate node of the plurality of intermediate nodes being defined between each respective series connected pair of transistors of the plurality of transistors, each transistor of the plurality of transistors having a gate coupled to the second control node;

a first common resistor between the first control node and the common node and in parallel with the plurality of transistors; and a plurality of capacitive components, each respective capacitive component of the plurality of capacitive components being coupled between a respective intermediate node of the plurality of intermediate nodes and the capacitive node, a voltage at the capacitive node being configured to be varied with a voltage at the second control node such that, at each respective intermediate node, a respective capacitive component is configured to accrue an opposite charge to a corresponding series connected pair of transistors of the plurality of transistors.

2. The switching component of claim 1 wherein each capacitive component of the plurality of capacitive components is configured to release its accrued charge when the series connected pair of transistors connected to a corresponding intermediate node are transitioned from an OFF state to an ON state.

3. The switching component of claim 1 wherein each intermediate node of the plurality of intermediate nodes is connected to a respective first transistor having a first parasitic capacitance between the gate of the respective first transistor and a respective intermediate node and a respective second transistor having a second parasitic capacitance between the gate of the respective second transistor and the respective intermediate node; and wherein each capacitive component has a capacitance between the respective intermediate node and the capacitive node, wherein for each respective intermediate node the capacitance of the connected capacitive component is equal or approximately equal to the sum of the first and second parasitic capacitances.

4. The switching component of claim 3 wherein, for each intermediate node of the plurality of intermediate nodes, the respective first transistor has a drain connected to the respective intermediate node and the respective second transistor has a source connected to the respective intermediate node, and wherein the first parasitic capacitance is formed between the gate of the respective first transistor and the drain of the respective first transistor and wherein the second parasitic capacitance is formed between the gate of the respective second transistor and the source of the respective second transistor.

5. The switching component of claim 1 wherein the first common resistor includes a plurality of resistive elements, and wherein each transistor of the plurality of transistors has a corresponding resistive element of the plurality of resistive elements connected in parallel with it such that each transistor is configured to selectively bypass its corresponding resistive element.

6. The switching component of claim 1 wherein the plurality of capacitive components are capacitors; or wherein the plurality of capacitive components are transistors, wherein for each of the transistors of the plurality of capacitive components the source and drain are connected.

7. A switch assembly for a radio frequency signal, the switch assembly comprising:
- a first node coupled to an input of the switch assembly, a second node coupled to an output of the switch assembly, a first control node, a second control node, a common node, a plurality of intermediate nodes, and a capacitive node;
- a first switch having a first plurality of transistors coupled between the first and second nodes, each transistor of the first plurality of transistors having a gate, a drain, and a source, each gate of the first plurality of transistors being coupled to the common node;
- a second switch coupled between the first control node and the common node, the second switch having a second plurality of transistors connected in series between the first control node and the common node, one of the plurality of intermediate nodes being defined between each series connected pair of transistors of the second plurality of transistors, each transistor of the second plurality of transistors having a gate coupled to the second control node; and
- a plurality of capacitive components, each respective capacitive component of the plurality of capacitive components being coupled between a respective intermediate node of the plurality of intermediate nodes and the capacitive node, a voltage at the capacitive node being configured to be varied with a voltage at the second control node such that, at each respective intermediate node, a respective capacitive component is configured to accrue an opposite charge to a corresponding series connected pair of transistors of the second plurality of transistors.

8. The switch assembly of claim 7 wherein each capacitive component in the second switch is configured to release its accrued charge when the series connected pair of transistors connected to a corresponding intermediate node are transitioned from an OFF state to an ON state.

9. The switch assembly of claim 7 wherein each intermediate node in the second switch is connected to a respective first transistor in the second plurality of transistors, the respective first transistor having a first parasitic capacitance between the gate of the respective first transistor and a respective intermediate node, and a respective second transistor in the second plurality of transistors, the respective second transistor having a second parasitic capacitance between the gate of the respective second transistor and the respective intermediate node; and
- wherein each capacitive component has a capacitance between the respective intermediate node and a respective capacitive node, wherein for each intermediate node the capacitance of the connected capacitive component is equal or approximately equal to the sum of the first and second parasitic capacitances.

10. The switch assembly of claim 9 wherein, for each intermediate node in the second switch, the respective first transistor has a drain connected to the respective intermediate node and the respective second transistor has a source connected to the respective intermediate node, and wherein the first parasitic capacitance is formed between the gate of the respective first transistor and the drain of the respective first transistor and wherein the second parasitic capacitance is formed between the gate of the respective second transistor and the source of the respective second transistor.

11. The switch assembly of claim 7 further comprising a first common resistor between the first control node and the common node and in parallel with the second plurality of transistors.

12. The switch assembly of claim 11 wherein the first common resistor includes a plurality of resistive elements, and wherein each transistor of the second plurality of transistors has a corresponding resistive element of the plurality of resistive elements connected in parallel with it such that each transistor in the second plurality of transistors is configured to selectively bypass its corresponding resistive element.

13. The switch assembly of claim 11 wherein the first control node is configured to receive a first control signal that is applied to the gates of transistors of the first plurality of transistors via the second switch through the second plurality of transistors and/or through the plurality of resistors.

14. The switch assembly of claim 13 wherein the first control signal is configured to operate the switch in an ON state by turning on each of the transistors of the first plurality of transistors such that a radio frequency signal received at the first node is provided to the second node.

15. The switch assembly of claim 13 wherein the first control signal is configured to operate the switch in an OFF state by turning off each transistor of the first plurality of transistors such that a radio frequency signal received at the first node is not provided to the second node.

16. The switch assembly of claim 7 wherein the plurality of capacitive components are capacitors; or wherein the plurality of capacitive components are transistors, wherein for each of the transistors of the plurality of capacitive components the source and drain are connected.

17. The switch assembly of claim 7 wherein the second control node is configured to receive a second control signal that is configured to operate the second switch in an OFF state such that the first control signal is applied to the gates of the first plurality of transistors through the plurality of resistors.

18. The switch assembly of claim 7 wherein the second control node is configured to receive a second control signal that is configured to operate the second switch in an ON state such that the common resistor is shorted and such that the first control signal is applied to the gates of the first plurality of transistors through the second plurality of transistors.

19. The switch assembly of claim 18 wherein the second control signal is configured to operate the second switch in the ON state whilst the first control signal is configured to transition the first switch between an ON state and an OFF state.

20. A method of designing a switch assembly for a radio frequency signal, the method comprising:
- arranging a first switch having a first plurality of transistors coupled between a first node and a second node, each transistor of the first plurality of transistors having a gate, a drain, and a source, each gate of the first plurality of transistors being coupled to a common node, the first node coupled to an input of the switch assembly, and the second node coupled to an output of the switch assembly;
- arranging a second switch coupled between the first control node and the common, the second switch having a second plurality of transistors connected in series between the first control node and the common node, one of the plurality of intermediate nodes being defined between each series connected pair of transistors of the second plurality of transistors, each transistor of the second plurality of transistors having a gate coupled to the second control node;
- a plurality of capacitive components, each respective capacitive component of the plurality of capacitive components being connected between a respective intermediate node of the plurality of intermediate nodes and the capacitive node, a voltage at the capacitive node being configured to be varied inversely with a voltage at the second control node such that, at each intermediate node, a respective capacitive component is configured to accrue an opposite charge to a corresponding series connected pair of transistors of the second plurality of transistors;

controlling the second switch to be in an ON state such that a first control signal received by the first control node passes through the second plurality of transistors between the first control node and the common node during a period in which the first switch is transitioning between an ON state and an OFF state; and controlling the second switch to be in an OFF state such that the first control signal does not pass through the second plurality of transistors between the first control node and the common node during a period in which the first switch is not transitioning between an ON state and an OFF state.

* * * * *